US011618711B2

(12) United States Patent
Hart et al.

(10) Patent No.: US 11,618,711 B2
(45) Date of Patent: Apr. 4, 2023

(54) COATED ARTICLES WITH OPTICAL COATINGS HAVING RESIDUAL COMPRESSIVE STRESS

(71) Applicant: CORNING INCORPORATED, Corning, NY (US)

(72) Inventors: Shandon Dee Hart, Elmira, NY (US); Guangli Hu, Berkeley Heights, NJ (US); Charles Andrew Paulson, Painted Post, NY (US); James Joseph Price, Corning, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 17/532,103

(22) Filed: Nov. 22, 2021

(65) Prior Publication Data

US 2022/0242781 A1   Aug. 4, 2022

Related U.S. Application Data

(63) Continuation of application No. 16/474,388, filed as application No. PCT/US2017/067332 on Dec. 19, 2017, now Pat. No. 11,242,280.
(Continued)

(51) Int. Cl.
*B32B 15/04* (2006.01)
*C03C 17/22* (2006.01)
(Continued)

(52) U.S. Cl.
CPC ............ *C03C 17/225* (2013.01); *C03C 3/085* (2013.01); *C03C 3/091* (2013.01); *C03C 3/095* (2013.01);
(Continued)

(58) Field of Classification Search
CPC ............................. C03C 2217/78; G02B 1/11
(Continued)

(56) References Cited

U.S. PATENT DOCUMENTS 4,168,113 A   9/1979 Chang et al.
4,995,684 A   2/1991 Tustison et al.
(Continued)

FOREIGN PATENT DOCUMENTS

CN   1380876 A   11/2002
CN   102121279 A   7/2011
(Continued)

OTHER PUBLICATIONS

Chinese Patent Application No. 201780086277.2, Decision on Rejection, dated Jul. 25, 2022, 2 pages, Chinese Patent Office.
(Continued)

*Primary Examiner* — Lauren R Colgan
(74) *Attorney, Agent, or Firm* — William J. Tucker

(57) ABSTRACT

Disclosed herein are coated articles which may include a substrate and an optical coating that includes one or more layers of deposited material. At least a portion of the optical coating may include a residual compressive stress of more than 100 MPa. The coated article may include a strain-to-failure of 0.4% or more as measured by a Ring-on-Ring Tensile Testing Procedure. The optical coating may include a maximum hardness of 8 GPa or more and an average photopic transmission of 50% or greater.

20 Claims, 6 Drawing Sheets

Related U.S. Application Data

(60) Provisional application No. 62/440,682, filed on Dec. 30, 2016.

(51) Int. Cl.

| | | |
|---|---|---|
| C03C 3/085 | (2006.01) | |
| C03C 3/091 | (2006.01) | |
| C03C 3/095 | (2006.01) | |
| C23C 14/00 | (2006.01) | |
| C23C 14/08 | (2006.01) | |
| C23C 14/10 | (2006.01) | |
| C23C 14/35 | (2006.01) | |
| C23C 14/06 | (2006.01) | |
| G02B 1/11 | (2015.01) | |

(52) U.S. Cl.
CPC ...... *C23C 14/0042* (2013.01); *C23C 14/0676* (2013.01); *C23C 14/08* (2013.01); *C23C 14/10* (2013.01); *C23C 14/352* (2013.01); *G02B 1/11* (2013.01); *C03C 2217/281* (2013.01); *C03C 2217/732* (2013.01); *C03C 2217/78* (2013.01); *C03C 2217/91* (2013.01); *C03C 2218/155* (2013.01)

(58) Field of Classification Search
USPC .......................................... 428/410, 411, 432
See application file for complete search history.

(56) References Cited

U.S. PATENT DOCUMENTS

| | | | |
|---|---|---|---|
| 5,035,745 A | 7/1991 | Lin et al. | |
| 5,508,368 A | 4/1996 | Knapp et al. | |
| 6,007,909 A | 12/1999 | Rolander et al. | |
| 8,081,169 B2 | 12/2011 | Lin et al. | |
| 8,187,671 B2 | 5/2012 | Sol | |
| 8,312,739 B2 | 11/2012 | Lee et al. | |
| 8,561,429 B2 | 10/2013 | Allan et al. | |
| 8,668,990 B2 * | 3/2014 | Broadway | C03C 17/3423 |
| | | | 428/428 |
| 9,586,858 B2 | 3/2017 | Bellman et al. | |
| 9,703,011 B2 | 7/2017 | Adib et al. | |
| 9,726,786 B2 | 8/2017 | Hart et al. | |
| 9,790,593 B2 * | 10/2017 | Adib | C23C 16/308 |
| 10,416,352 B2 * | 9/2019 | Hart | G02B 1/115 |
| 10,837,103 B2 * | 11/2020 | Adib | C23C 16/325 |
| 10,948,629 B2 * | 3/2021 | Hart | C03C 17/3411 |
| 11,242,280 B2 * | 2/2022 | Hart | C23C 14/10 |
| 2006/0008654 A1 | 1/2006 | Veerasamy | |
| 2006/0008656 A1 | 1/2006 | Veerasamy | |
| 2009/0297835 A1 | 12/2009 | Okada et al. | |
| 2012/0196133 A1 * | 8/2012 | Broadway | C03C 17/3417 |
| | | | 428/428 |
| 2014/0079747 A1 | 3/2014 | Dihora et al. | |
| 2014/0090864 A1 * | 4/2014 | Paulson | C03C 21/002 |
| | | | 428/428 |
| 2014/0106146 A1 | 4/2014 | Decker et al. | |
| 2014/0106150 A1 | 4/2014 | Decker et al. | |
| 2014/0113083 A1 | 4/2014 | Lee et al. | |
| 2015/0166407 A1 | 6/2015 | Varshneya et al. | |
| 2015/0322270 A1 | 11/2015 | Amin et al. | |
| 2015/0323705 A1 * | 11/2015 | Hart | G02B 1/14 |
| | | | 359/601 |
| 2016/0002772 A1 | 1/2016 | Kanaoka et al. | |
| 2016/0083835 A1 * | 3/2016 | Adib | C23C 16/308 |
| | | | 428/332 |
| 2016/0107928 A1 | 4/2016 | Bayne et al. | |
| 2017/0217831 A1 * | 8/2017 | Hart | C03C 3/091 |
| 2018/0029929 A1 | 2/2018 | Paulson | |
| 2019/0225538 A1 | 7/2019 | Harris et al. | |
| 2020/0156992 A1 * | 5/2020 | Baloukas | H05K 5/0017 |

FOREIGN PATENT DOCUMENTS

| | | |
|---|---|---|
| CN | 202416723 U | 9/2012 |
| CN | 104718071 A | 6/2015 |
| CN | 105271795 A | 1/2016 |
| CN | 105764866 A | 7/2016 |
| CN | 105874356 A | 8/2016 |
| CN | 106103370 A | 11/2016 |
| DE | 102014108059 A1 | 12/2015 |
| JP | 02-143918 A | 6/1990 |
| JP | 05-051237 A | 3/1993 |
| JP | 2008-147053 A | 6/2008 |
| JP | 2009-217018 A | 9/2009 |
| JP | 2015-535731 A | 12/2015 |
| KR | 10-2009-0063394 A | 6/2009 |
| KR | 10-2015-0067278 A | 6/2015 |
| WO | 2006/020136 A2 | 2/2006 |
| WO | 2014/182520 A1 | 11/2014 |
| WO | 2015/076914 A1 | 5/2015 |
| WO | 2015/142837 A1 | 9/2015 |
| WO | 2016/018490 A1 | 2/2016 |
| WO | 2016/138195 A1 | 9/2016 |

OTHER PUBLICATIONS

Korean Patent Application No. 10-2019-7020112, Korean Office Action, dated Jul. 20, 2022, 17 pages (10 pages of English Translation and 7 pages of Original Copy); Korean Patent Office.
Chakravarthy et al., "Thin Film and Substrate Cracking Under the Influence of Externally Applied Loads," Engineering Fracture Mechanics 72 (2005) p. 1286.
Chi et al; "Cracking in Coating-Substrate Composites With Multi-Layered and FGM Coatings," Engineering Fracture Mechanics 70 (2003) p. 1227.
Chinese Patent Application No. 201780086277.2, Office Action dated Jun. 8, 2021, 5 pages (English Translation Only), Chinese Patent Office.
Fischer-Cripps; "Critical Review of Analysis and Interpretation of Nanoindentation Test Data", Surface & Coatings Technology, 200, 4153 4165 (2006).
Hart; "Coated Glass Having Retained Strength" Filed as U.S. Appl. No. 61/712,908, filed Oct. 12, 2012; 31 Pages.
Hay et al; "Continuous Stiffness Measurement During Instrumented Indentation Testing" Experimental Techniques, 34 (3) 86 94 (2010).
Hu et al; "Dynamic Fracturing of Strengthened Glass Under Biaxial Tensile Loading";Journal of Non-Crystalline Solids, 2014. 405(0): p. 153-158.
International Search Report and Writien Opinion of the International Searching Authority; PCT/US2017/067332; dated Mar. 26, 2018; 17 Pages; European Patent Office.
Japanese Patent Application No. 2019-535306, Office Action dated Nov. 25, 2021, 10 pages (5 pages of English Translation and 5 pages of Original Copy); Japanese Patent Office.
Leung et al; "The Cracking Resistance of Nanoscale Layers and Films", J. Mater. Res. 10, 7, p. 1693, 1995.
Oliver et al; "An Improved Technique for Determining Hardness and Elastic Modulus Using Load and Displacement Sensing Indentation Experiments"; J. Mater. Res., vol. 7, No. 6, 1992 pp. 1564-1583.
Oliver et al; "Measurement of Hardness and Elastic Modulus by Instrumented Indentation:; Advances in Understanding and Refinements to Methodology"; J. Mater. Res., vol. 19, No. 1, 2004; pp. 3-20.

* cited by examiner

COATED ARTICLES WITH OPTICAL COATINGS HAVING RESIDUAL COMPRESSIVE STRESS

CROSS-REFERENCE TO RELATED APPLICATIONS

This application is a continuation application of and claims priority to U.S. patent application Ser. No. 16/474,388, filed on Jun. 27, 2019, now U.S. Pat. No. 11,242,280, which claims the benefit of priority under 35 U.S.C. § 371 of International Application No. PCT/US17/67332, filed Dec. 19, 2017, which claims the benefit of priority under 35 U.S.C. § 119 of U.S. Provisional Patent Application Ser. No. 62/440,682 filed on Dec. 30, 2016, the content of each of which is relied upon and incorporated herein by reference in its entirety.

BACKGROUND

Field

This disclosure relates to durable and/or scratch-resistant articles and methods for making the same, and more particularly to durable and/or scratch-resistant optical coatings on transparent substrates.

Technical Background

Cover articles are often used to protect devices within electronic products, to provide a user interface for input and/or display, and/or many other functions. Such products include mobile devices, such as smart phones, wearables (e.g. watches), mp3 players, and computer tablets. Cover articles also include architectural articles, transportation articles (e.g., articles used in automotive applications, trains, aircraft, sea craft, etc.), appliance articles, or any article that benefits from some transparency, scratch-resistance, abrasion resistance, or a combination thereof. These applications often demand scratch-resistance and strong optical performance characteristics, in terms of maximum light transmittance and minimum reflectance. Furthermore, some cover applications benefit from a color exhibited or perceived, in reflection and/or transmission, that does not change appreciably as the viewing angle is changed. In display applications, this is because, if the color in reflection or transmission changes with viewing angle to an appreciable degree, the user of the product will perceive a change in color or brightness of the display, which can diminish the perceived quality of the display. In other applications, changes in color may negatively impact the aesthetic look or other functions of the device.

The optical performance of cover articles can be improved by using various anti-reflective coatings; however known anti-reflective coatings are susceptible to wear or abrasion. Such abrasion can compromise any optical performance improvements achieved by the anti-reflective coating. Abrasion damage can include reciprocating sliding contact from counter face objects (e.g., fingers). In addition, abrasion damage can generate heat, which can degrade chemical bonds in the film materials and cause flaking and other types of damage to the cover glass. Since abrasion damage is often experienced over a longer term than the single events that cause scratches, the coating materials experiencing abrasion damage can also oxidize, which can further degrades the durability of the coating.

Known anti-reflective coatings are also susceptible to scratch damage and, often, are even more susceptible to scratch damage than the underlying substrates on which such coatings are disposed. In some instances, a significant portion of such scratch damage includes microductile scratches, which typically include a single groove in a material having extended length and with depths in the range from about 100 nm to about 500 nm. Microductile scratches may be accompanied by other types of visible damage, such as sub-surface cracking, frictive cracking, chipping and/or wear. Evidence suggests that a majority of such scratches and other visible damage is caused by sharp contact that occurs in a single contact event. Once a significant scratch appears on the cover substrate, the appearance of the article is degraded since the scratch causes an increase in light scattering, which may cause significant reduction in brightness, clarity and contrast of images on the display. Significant scratches can also affect the accuracy and reliability of articles including touch sensitive displays. Single event scratch damage can be contrasted with abrasion damage. Single event scratch damage is not caused by multiple contact events, such as reciprocating sliding contact from hard counter face objects (e.g., sand, gravel and sandpaper), nor does it typically generate heat, which can degrade chemical bonds in the film materials and cause flaking and other types of damage. In addition, single event scratching typically does not cause oxidization or involve the same conditions that cause abrasion damage and therefore, the solutions often utilized to prevent abrasion damage may not also prevent scratches. Moreover, known scratch and abrasion damage solutions often compromise the optical properties.

SUMMARY

According to some embodiments, a coated article may comprise a substrate having a major surface, and an optical coating disposed on the major surface of the substrate and forming an air-side surface. The optical coating may comprise one or more layers of deposited material. At least a portion of the optical coating may comprise a residual compressive stress of about 50 MPa or more. The coated article may have a strain-to-failure of about 0.5% or more as measured by a Ring-on-Ring Tensile Testing Procedure. The coated article may have an average photopic transmission of about 80% or greater.

According to some embodiments, a method for making a coated article may comprise depositing an optical coating onto a major surface of a transparent substrate. The optical coating may form an air-side surface and comprise one or more layers of deposited material. At least a portion of the optical coating may comprise a residual compressive stress of about 50 MPa or more. The coated article may have a strain-to-failure of about 0.5% or more as measured by a Ring-on-Ring Tensile Testing Procedure. The coated article may have an average photopic transmission of about 80% or greater.

Embodiment 1. A coated article comprising:
a substrate comprising a major surface;
an optical coating disposed on the major surface of the substrate and forming an air-side surface, the optical coating comprising one or more layers of deposited material;
wherein:
at least a portion of the optical coating comprises a residual compressive stress of more than about 50 MPa;

the optical coating comprises a strain-to-failure of about 0.4% or more as measured by a Ring-on-Ring Tensile Testing Procedure;

the optical coating comprises a maximum hardness of 12 GPa or more as measured on the air-side surface by a Berkovich Indenter Hardness Test along an indentation depth of about 50 nm and greater; and the coated article comprises an average photopic transmission of about 80% or greater.

Embodiment 2. The coated article of embodiment 1, wherein one of:

(i) the optical coating comprises: a thickness of from about 350 nm to less than about 600 nm; a strain to failure greater than about 0.65%; and a maximum hardness of 14 GPa or more; and (ii) the optical coating comprises: a thickness of about 600 nm or more; a coating strain to failure greater than about 0.4%; and a maximum hardness of 13 GPa or more.

Embodiment 3. The coated article of embodiment 1 or embodiment 2, wherein the portion of the optical coating having the residual stress further comprises a plurality of ion-exchangeable metal ions and a plurality of ion-exchanged metal ions, the ion-exchanged metal ions comprising an atomic radius larger than the atomic radius of the ion-exchangeable metal ions.

Embodiment 4. The coated article of embodiment 1 or embodiment 2, wherein the residual compressive stress is imparted on the optical coating by mechanical blasting.

Embodiment 5. The coated article of embodiment 1 or embodiment 2, wherein the at least a portion of the optical coating has a coefficient of thermal expansion and the substrate has a coefficient of thermal expansion, wherein the substrate comprises a greater coefficient of thermal expansion than does the at least a portion of the optical coating, wherein the coefficients of thermal expansion are measured over a temperature range of from about 20° C. to about 300° C.

Embodiment 6. The coated article of embodiment 5, wherein the ratio of the coefficient of thermal expansion of the substrate to the coefficient of thermal expansion of the at least a portion of the optical coating is about 1.2:1 or more.

Embodiment 7. The coated article of any one of embodiments 1-6, wherein the coated article exhibits a maximum hardness of about 14 GPa or greater as measured on the air-side surface by a Berkovich Indenter Hardness Test along an indentation depth of about 50 nm and greater.

Embodiment 8. The coated article of any one of embodiments 1-7, wherein the substrate comprises an amorphous substrate or a crystalline substrate.

Embodiment 9. A method for making a coated article, the method comprising:

depositing an optical coating onto a major surface of a substrate, the optical coating forming an air-side surface and comprising one or more layers of deposited material;

wherein:

at least a portion of the optical coating comprises a residual compressive stress of more than about 50 MPa;

the optical coating comprises a strain-to-failure of about 0.4% or more as measured by a Ring-on-Ring Tensile Testing Procedure;

the optical coating comprises a maximum hardness of 12 GPa or more as measured on the air-side surface by a Berkovich Indenter Hardness Test along an indentation depth of about 50 nm and greater; and the coated article comprises an average photopic transmission of about 80% or greater.

Embodiment 10. The method of embodiment 9, wherein one of:

(i) the optical coating comprises: a thickness of from about 350 nm to less than about 600 nm; a strain to failure greater than about 0.65%; and a maximum hardness of 14 GPa or more; and (ii) the optical coating comprises: a thickness of about 600 nm or more; a coating strain to failure greater than about 0.4%; and a maximum hardness of 13 GPa or more.

Embodiment 11. The method of embodiment 9 or embodiment 10, further comprising imparting residual compressive stress on the optical coating by ion-exchange processing the deposited optical coating.

Embodiment 12. The method of embodiment 11, wherein the ion-exchange processing comprises contacting the optical coating with an ionic salt bath.

Embodiment 13. The method of embodiment 11 or embodiment 12, wherein the ion-exchange processing comprises field-assisted ion-exchange.

Embodiment 14. The method of embodiment 9 or embodiment 10, further comprising imparting residual compressive stress on the optical coating by mechanical blasting.

Embodiment 15. The method of embodiment 9 or embodiment 10, further comprising:

deforming the substrate under physical stress prior to the deposition of the optical coating; and allowing the deformed substrate to reshape itself following the deposition of the optical coating;

wherein the optical coating is deposited onto a deformed substrate.

Embodiment 16. The method of embodiment 9 or embodiment 10, further comprising disposing the a portion of the optical coating on the substrate, heating the substrate, and allowing the substrate to cool with the coating disposed thereon.

Embodiment 17. The method of any one of embodiments 9-16, wherein the coated article exhibits a maximum hardness of about 14 GPa or greater as measured on the air-side surface by a Berkovich Indenter Hardness Test along an indentation depth of about 50 nm and greater.

Embodiment 18. A consumer electronic product, having: a housing having a front surface, a back surface and side surfaces; electrical components provided at least partially within the housing, the electrical components including at least a controller, a memory, and a display, the display being provided at or adjacent the front surface of the housing; and a cover glass disposed over the display, wherein at least one of a portion of the housing or the cover glass comprises the coated article of any one of embodiments 1-8.

Additional features and advantages will be set forth in the detailed description which follows, and in part will be readily apparent to those skilled in the art from that description or recognized by practicing the embodiments as described herein, including the detailed description which follows, the claims, as well as the appended drawings. It is to be understood that various features disclosed in this specification and in the drawings can be used in any and all combinations.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiments, and together with the description serve to explain principles and operation of the various embodiments.

DETAILED DESCRIPTION

Figure 1:
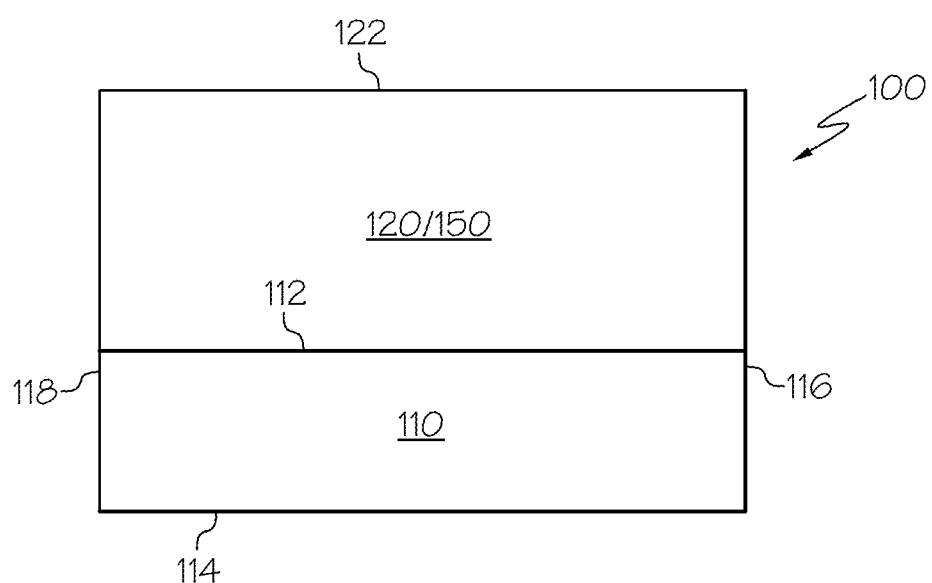
FIG. 1 is a schematic cross-sectional side view of a coated article, according to one or more embodiments described herein.

Reference will now be made in detail to various embodiments, examples of which are illustrated in the accompanying drawings. Described herein are embodiments of coated articles which include substrates and optical coatings which have relatively high hardness, have desirable optical properties, and have a relatively high strain-to-failure value when exposed to a flexural load. Optical coatings which have high hardness may be deposited upon substrates (e.g., transparent substrates, or glass substrates; as used herein the term "glass" is meant to include any material made at least partially of glass, including glass and glass-ceramics.) to protect the surface of the transparent substrate from abrasion or scratch damage. However, under flexural loads (e.g., bending of the transparent substrate), while some transparent substrates may be suited to withstand such flexural loads, the optical coatings may be susceptible to damage such as cracking. For example, when placed under a flexural load (i.e., physically deformed in some way), a coated article may exhibit cracking in the relatively brittle coating while the substrate remains largely intact. Damage to the hard optical coating may be especially prevalent for relatively thick optical coatings, such as those having a thickness of greater than about 500 nm, or a thickness of 1 micron or greater. This damage can be readily visible, especially for thicker coatings, and can disrupt the appearance and/or function of the device even if the substrate remains intact. In some cases, the coating failure can occur simultaneously with the substrate failure, meaning both failure values are the same. In either case, it is desirable to have a higher value of coating failure strain. Therefore, it is desirable to utilize optical coatings which are not damaged under flexural loads but have good optical characteristics and high hardness. Damage to a coated substrate, or a coating on a substrate, can be characterized by a strain-to-failure value, which is discussed in detail herein. In one or more embodiments, the coated articles may have good optical characteristics, such as low reflectance, while exhibiting relatively high hardness, such as 12 GPa or greater (for example 13 GPa or greater, 14 GPa or greater, 15 GPa or greater, 16 GPa or greater, 17 GPa or greater, 18 GPa or greater, 19 GPa or greater, 20 GPa or greater, and all ranges and sub-ranges between the foregoing values), and relatively high strain-to-failure, such as 0.5% or greater (for example 0.6% or greater, 0.7% or greater, 0.8% or greater, 0.9% or greater, and all ranges and sub-ranges between the foregoing values).

In one or more embodiments, the optical coating, or at least a portion of the optical coating (e.g., one or more layers of the optical coating) may have a relatively high residual stress. As used herein, "residual compressive stress" refers to compressive stresses remaining in the optical coating after fabrication of the coating. As used herein the residual compressive stress is measured as follows. The desired coating is deposited onto a substrate. A surface profiler is used to measure the curvature of the sample, as induced by the coating. The Stoney equation, as known in the art, is then used to convert the curvature (or warp) of the sample into a stress value Without being bound by theory, it is believed that introduced residual compressive stress in at least a portion of the coating may increase the strain-to-failure of the coating or the coated article. The residual compressive stress may be introduced into the optical coating by various methods which are disclosed herein. For example, without being bound by theory, it is contemplated that residual compressive stress may be introduced to an optical coating, or portion of an optical coating, by utilizing particular deposition parameters (e.g., pressure, rate, ion-assist), by utilizing an ion-exchange process, by utilizing an ion-implantation process, by utilizing a mechanical blasting process, by depositing the optical coating onto a deformed substrate under physical stress and then allowing the deformed substrate to remove stress by reshaping itself (and thus introducing stress into the optical coating), or by increasing the difference in the linear coefficient of thermal expansion ("CTE") between the optical coating and the substrate so that residual compressive stress is increased as the coated article is cooled to room temperature. The CTE over the temperature range of 20° C. to 300° C. is expressed in terms of ppm/K and was determined using a push-rod dilatometer in accordance with ASTM E228-11. These processes and configurations will be explained in greater detail herein with reference to coated articles. It should be understood that the present embodiments of coated articles are not limited to those produced by particular methods and configurations disclosed herein, but rather the methods and configurations disclosed herein for forming high levels of compressive stress are examples of suitable techniques for achieving high residual compressive stress coatings which may have relatively high strain-to-failure values. For example, in one or more embodiments, at least a portion of one or more layers of the optical coating may have a residual compressive stress of about 50 MPa or more, about 75 MPa or more, about 100 MPa or more, about 200 MPa or more, about 500 MPa or more, or even about 1000 MPa or more, and all ranges and sub-ranges between the foregoing values.

Referring to FIG. 1, a coated article 100 according to one or more embodiments may include a substrate 110, and an optical coating 120 disposed on the substrate 110. The substrate 110 includes opposing major surfaces 112, 114 and opposing minor surfaces 116, 118. The optical coating 120 is shown in FIG. 1 as disposed on a first opposing major surface 112; however, the optical coating 120 may be disposed on the second opposing major surface 114 and/or one or both of the opposing minor surfaces 116, 118, in addition to or instead of being disposed on the first opposing major surface 112. The optical coating 120 forms an air-side surface 122.

The optical coating 120 includes at least one layer of at least one material. The term "layer" may include a single layer or may include one or more sub-layers. Such sub-layers may be in direct contact with one another. The sub-layers may be formed from the same material or two or more different materials. In one or more alternative embodiments, such sub-layers may have intervening layers of different materials disposed therebetween. In one or more embodiments, a layer may include one or more contiguous and uninterrupted layers and/or one or more discontinuous and interrupted layers (i.e., a layer having different materials formed adjacent to one another). A layer or sub-layer may be formed by any known method in the art, including discrete deposition or continuous deposition processes. In one or more embodiments, the layer may be formed using only continuous deposition processes, or, alternatively, only discrete deposition processes.

As used herein, the term "dispose" includes coating, depositing, and/or forming a material onto a surface using any known or to be developed method in the art. The disposed material may constitute a layer, as defined herein. As used herein, the phrase "disposed on" includes forming a material onto a surface such that the material is in direct contact with the surface, or alternatively includes embodiments where the material is formed on a surface with one or more intervening material(s) disposed between material and the surface. The intervening material(s) may constitute a layer, as defined herein.

The optical coating 120 may have thickness of from about 100 nm to about 10 microns, For example, the optical coating may have a thickness greater than or equal to about 200 nm, 300 nm, 400 nm, 500 nm, 600 nm, 700 nm, 800 nm, 900 nm, 1 micron, 2 microns, 3 microns, 4 microns, 5 microns, 6 microns, 7 microns, or even 8 microns, and less than or equal to about 10 microns, and any ranges and sub-ranges between the foregoing values.

In one or more embodiments, the optical coating 120 may include, or consist of, a scratch-resistant layer 150. FIG. 1 depicts an optical coating which consists of a scratch-resistant layer. However, in other embodiments, additional layers may be provided in the optical coating, as are described herein. According to some embodiments, the scratch-resistant layer 150 may comprise one or more materials chosen from $Si_uAl_vO_xN_y$, $Ta_2O_5$, $Nb_2O_5$, AlN, $Si_3N_4$, $AlO_xN_y$, $SiO_xN_y$, $SiN_x$, $SiN_x$:$H_y$, $HfO_2$, $TiO_2$, $ZrO_2$, $Y_2O_3$, $Al_2O_3$, $MoO_3$, diamond-like carbon, or combinations thereof. Exemplary materials used in the scratch-resistant layer 150 may include an inorganic carbide, nitride, oxide, diamond-like material, or combination thereof. Examples of suitable materials for the scratch-resistant layer 150 include metal oxides, metal nitrides, metal oxynitride, metal carbides, metal oxycarbides, and/or combinations thereof. Exemplary metals include B, Al, Si, Ti, V, Cr, Y, Zr, Nb, Mo, Sn, Hf, Ta and W. Specific examples of materials that may be utilized in the scratch-resistant layer 150 may include $Al_2O_3$, AlN, $AlO_xN_y$, $Si_3N_4$, $SiO_xN_y$, $Si_uAl_vO_xN_y$, diamond, diamond-like carbon, $Si_xC_y$, $Si_xO_yCz$, $ZrO_2$, $TiO_xN_y$, and combinations thereof. The scratch-resistant layer 150 may also comprise nanocomposite materials, or materials with a controlled microstructure, to improve hardness, toughness, or abrasion/wear resistance. For example the scratch-resistant layer 150 may comprise nanocrystallites in the size range from about 5 nm to about 30 nm. In embodiments, the scratch-resistant layer 150 may comprise transformation-toughened zirconia, partially stabilized zirconia, or zirconia-toughened alumina. In some embodiments, the scratch-resistant layer 150 exhibits a fracture toughness value greater than about 1 MPa√m and simultaneously exhibits a hardness value greater than about 8 GPa.

In one or more embodiments, the scratch-resistant layer 150 may comprise a compositional gradient. For example, a scratch-resistant layer 150 may include a compositional gradient of $Si_uAl_vO_xN_y$, where the concentration of any one or more of Si, Al, O and N are varied to increase or decrease the refractive index. The refractive index gradient may also be formed using porosity. Such gradients are more fully described in U.S. patent application Ser. No. 14/262,224, entitled "Scratch-Resistant Articles with a Gradient Layer", filed on Apr. 28, 2014, which is hereby incorporated by reference in its entirety.

Figure 2:
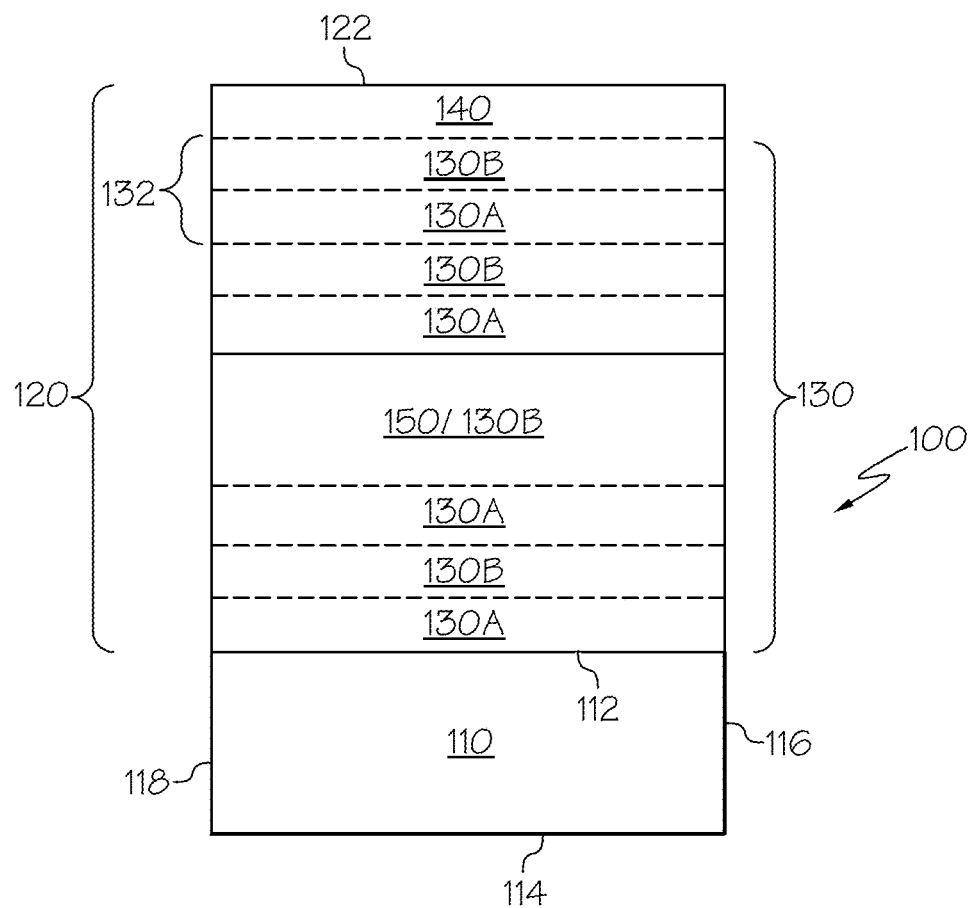
FIG. 2 is a schematic cross-sectional side view of a coated article, according to one or more embodiments described herein.

In one or more embodiments, as shown in FIG. 2, the optical coating 120 may include an anti-reflective coating 130 which may include a plurality of layers (130A, 130B). In one or more embodiments, the anti-reflective coating 130 may include a period 132 comprising two layers, such as a low RI layer 130A and a high RI layer 130B. As shown in FIG. 2, the anti-reflective coating 130 may include a plurality of periods 132. In other embodiments, a single period may include three layers such as a low RI layer, a medium RI layer, and a high RI layer. Throughout this disclosure, it should be understood that FIG. 2 is an example of some embodiments of an optical coating 120 having periods 132 and that that the properties (e.g., color, hardness, etc.) and materials of the optical coatings 120 described herein should not be limited to the embodiments of FIG. 1 or FIG. 2.

As used herein, the terms "low RI", "high RI" and "medium RI" refer to the relative values for the refractive index ("RI") to one another (i.e., low RI<medium RI<high RI). In one or more embodiments, the term "low RI", when used with the low RI layer, includes a range from about 1.3 to about 1.7 or 1.75, and any ranges and sub-ranges between the foregoing values. In one or more embodiments, the term "high RI", when used with the high RI layer, includes a range from about 1.7 to about 2.5 (e.g., about 1.85 or greater), and any ranges and sub-ranges between the foregoing values. In one or more embodiments, the term "medium RI", when used with a third layer of a period, includes a range from about 1.55 to about 1.8, and any ranges and sub-ranges between the foregoing values. In some embodiments, the ranges for low RI, high RI, and/or medium RI may overlap; however, in most instances, the layers of the anti-reflective coating 130 have the general relationship regarding RI of: low RI<medium RI<high RI (where "medium RI" is applicable in the case of a three layer period). In one or more embodiments, the difference in the refractive index of the low RI layer and the high RI layer may be about 0.01 or greater, about 0.05 or greater, about 0.1 or greater, or even about 0.2 or greater, and any ranges and sub-ranges between the foregoing values.

For example, in FIG. 2 the period 132 may include a low RI layer 130A and a high RI layer 130B. When a plurality of periods are included in the optical coating 120, the low RI layers 130A (designated as "L") and the high RI layers 130B (designated as "H") alternate in the following sequence of layers: L/H/L/H . . . or H/L/H/L . . . , such that the low RI layers and the high RI layers alternate along the physical thickness of the optical coating 120. In the embodiments depicted in FIG. 2, the anti-reflective coating 130 includes four periods 132, where each period 132 includes a low RI layer 130A and a high RI layer 130B. In some embodiments, the anti-reflective coating 130 may include up to 25 periods. For example, the anti-reflective coating 130 may include from about 2 to about 20 periods, from about 2 to about 15 periods, from about 2 to about 10 periods, from about 2 to about 12 periods, from about 3 to about 8 periods, or from about 3 to about 6 periods, for example, 3 periods, 4 periods, 5 periods, 6 periods, 7 periods, 8 periods, 9 periods, 10 periods, 11 periods, 12 periods, 13 periods, 14 periods, 15 periods, 16 periods, 17 periods, 18 periods, 19 periods, 20 periods, 21 periods, 22 periods, 23 periods, 24 periods, 25 periods, and any ranges and sub-ranges between the foregoing values.

Example materials suitable for use in the anti-reflective coating 130 include, without limitation, $SiO_2$, $Al_2O_3$, $GeO_2$, SiO, AlOxNy, AlN, $SiN_x$, $SiO_xN_y$, $Si_uAl_vO_xN_y$, $Ta_2O_5$, $Nb_2O_5$, $TiO_2$, $ZrO_2$, TiN, MgO, $MgF_2$, $BaF_2$, $CaF_2$, $SnO_2$, $HfO_2$, $Y_2O_3$, $MoO_3$, $DyF_3$, $YbF_3$, $YF_3$, $CeF_3$, polymers, fluoropolymers, plasma-polymerized polymers, siloxane polymers, silsesquioxanes, polyimides, fluorinated polyimides, polyetherimide, polyethersulfone, polyphenylsulfone, polycarbonate, polyethylene terephthalate, polyethylene naphthalate, acrylic polymers, urethane polymers, polymethylmethacrylate, other materials cited below as suitable for use in a scratch-resistant layer, and other materials known in the art. Some examples of suitable materials for use in a low RI layer 130A include, without limitation, $SiO_2$, $Al_2O_3$, $GeO_2$, SiO, $AlO_xN_y$, $SiO_xN_y$, MgO, $MgAl_2O_4$, $MgF_2$, $BaF_2$, $CaF_2$, $DyF_3$, $YbF_3$, $YF_3$, and $CeF_3$. The nitrogen content of the materials for use in a low RI layer 130A may be minimized (e.g., in materials such as $Al_2O_3$ and $MgAl_2O_4$). Some examples of suitable materials for use in a high RI layer 130B include, without limitation, $Si_uAl_vO_xN_y$, $Ta_2O_5$, $Nb_2O_5$, AlN, $Si_3N_4$, $AlO_xN_y$, $SiO_xN_y$, $SiN_x$, $SiN_x:H_y$, $HfO_2$, $TiO_2$, $ZrO_2$, $Y_2O_3$, $Al_2O_3$, $MoO_3$, and diamond-like carbon. In one or more embodiments, the high RI layer 130B may have high hardness (e.g., hardness of greater than 8 GPa), and the high RI materials listed above may comprise high hardness and/or scratch resistance. The oxygen content of the materials for the high RI layer 130B may be minimized, especially in $SiN_x$ or $AlN_x$ materials. $AlO_xN_y$ materials may be considered to be oxygen-doped $AlN_x$ (i.e., they may have an $AlN_x$ crystal structure (e.g., wurtzite) and need not have an AlON crystal structure). Exemplary $AlO_xN_y$ high RI materials may comprise from about 0 atom % to about 20 atom % oxygen, or from about 5 atom % to about 15 atom % oxygen, and any ranges and sub-ranges between the foregoing values, while including 30 atom % to about 50 atom % nitrogen, and any ranges and sub-ranges between the foregoing values. Exemplary $Si_uAl_vO_xN_y$ high RI materials may comprise from about 10 atom % to about 30 atom % or from about 15 atom % to about 25 atom % silicon, from about 20 atom % to about 40 atom % or from about 25 atom % to about 35 atom % aluminum, from about 0 atom % to about 20 atom % or from about 1 atom % to about 20 atom % oxygen, and from about 30 atom % to about 50 atom % nitrogen. The foregoing materials may be hydrogenated up to about 30% by weight. Where a material having a medium refractive index is desired, some embodiments may utilize AlN and/or $SiO_xN_y$. It should be understood that a scratch-resistant layer 150 may comprise any of the materials disclosed as suitable for use in a high RI layer.

As depicted in FIG. 2, in one or more embodiments, the optical coating 120 may comprise a scratch-resistant layer 150 that is integrated as a high RI layer, and one or more low RI layers 130A and high RI layers 130B may be positioned over the scratch-resistant layer 150. The scratch-resistant layer may be alternately defined as the thickest high RI layer in the overall optical coating 120 or in the overall coated article 100. Without being bound by theory, it is believed that the coated article 100 may exhibit increased hardness at indentation depths when a relatively thin amount of material is deposited over the scratch-resistant layer 150. Further, the inclusion of low RI and high RI layers over the scratch-resistant layer 150 may enhance the optical properties of the coated article 100. In some embodiments, relatively few layers (e.g., 1, 2, 3, 4, or 5 layers) may positioned over the scratch-resistant layer 150 and these layers may each be relatively thin (e.g. less than 100 nm, less than 75 nm, less than 50 nm, or even less than 25 nm, and any ranges and sub-ranges between the foregoing values).

The scratch-resistant layer 150 may be relatively thick as compared with other layers, such as greater than or equal to about 300 nm, 400 nm, 500 nm, 600 nm, 700 nm, 800 nm, 900 nm, 1 micron, 2 microns, 3 microns, 4 microns, 5 microns, 6 microns, 7 microns, or even 8 microns, and any ranges and sub-ranges between the foregoing values. For example a scratch-resistant layer may have a thickness from about 300 nm to about 10 microns.

In one or more embodiments, the optical coating 120 may include one or more additional top coatings 140 disposed on the anti-reflective optical coating 120, as shown in FIG. 2. In one or more embodiments, the additional top coating 140 may include an easy-to-clean coating. An example of a suitable an easy-to-clean coating is described in U.S. patent application Ser. No. 13/690,904, entitled "PROCESS FOR MAKING OF GLASS ARTICLES WITH OPTICAL AND EASY-TO-CLEAN COATINGS," filed on Nov. 30, 2012, which is incorporated herein in its entirety by reference. The easy-to-clean coating may have a thickness in the range from about 1 nm to about 50 nm, and any ranges and sub-ranges between the foregoing values, and may include known materials such as fluorinated silanes. The easy-to-clean coating may alternately or additionally comprise a low-friction coating or surface treatment. Exemplary low-friction coating materials may include diamond-like carbon, silanes (e.g. fluorosilanes), phosphonates, alkenes, and alkynes. In some embodiments, the easy-to-clean coating may have a thickness in the range from about 1 nm to about 40 nm, from about 1 nm to about 30 nm, from about 1 nm to about 25 nm, from about 1 nm to about 20 nm, from about 1 nm to about 15 nm, from about 1 nm to about 10 nm, from about 5 nm to about 50 nm, from about 10 nm to about 50 nm, from about 15 nm to about 50 nm, from about 7 nm to about 20 nm, from about 7 nm to about 15 nm, from about 7 nm to about 12 nm or from about 7 nm to about 10 nm, and all ranges and sub-ranges therebetween.

The top coating 140 may include a scratch-resistant layer or layers which comprise any of the materials disclosed as being suitable for use in the scratch-resistant coating 150. In some embodiments, the additional coating 140 includes a combination of easy-to-clean material and scratch-resistant material. In one example, the combination includes an easy-to-clean material and diamond-like carbon. Such additional top coatings 140 may have a thickness in the range from about 1 nm to about 50 nm. The constituents of the additional coating 140 may be provided in separate layers. For example, the diamond-like carbon may be disposed as a first layer and the easy-to-clean can be disposed as a second layer on the first layer of diamond-like carbon. The thicknesses of the first layer and the second layer may be in the ranges provided above for the additional coating. For example, the first layer of diamond-like carbon may have a thickness of about 1 nm to about 20 nm or from about 4 nm to about 15 nm (or more specifically about 10 nm), and any ranges and sub-ranges between the foregoing values, and the second layer of easy-to-clean may have a thickness of about 1 nm to about 10 nm (or more specifically about 6 nm), and any ranges and sub-ranges between the foregoing values. The diamond-like coating may include tetrahedral amorphous carbon (Ta—C), Ta—C:H, and/or a-C—H.

In one or more embodiments, at least one of the layers (such as a low RI layer 130A or a high RI layer 130B) of the anti-reflective coating 130 may include a specific optical thickness (or optical thickness range). As used herein, the term "optical thickness" refers to the product of the physical thickness and the refractive index of a layer. In one or more embodiments, at least one of the layers of the anti-reflective coating 130 may have an optical thickness in the range from about 2 nm to about 200 nm, from about 10 nm to about 100 nm, from about 15 nm to about 100 nm, from about 15 to about 500 nm, or from about 15 to about 5000 nm, and any ranges and sub-ranges between the foregoing values. In some embodiments, all of the layers in the anti-reflective coating 130 may each have an optical thickness in the range from about 2 nm to about 200 nm, from about 10 nm to about 100 nm, from about 15 nm to about 100 nm, from about 15 to about 500 nm, or from about 15 to about 5000 nm, and any ranges and sub-ranges between the foregoing values. In some embodiments, at least one layer of the anti-reflective coating 130 has an optical thickness of about 50 nm or greater. In some embodiments, each of the low RI layers 103A have an optical thickness in the range from about 2 nm to about 200 nm, from about 10 nm to about 100 nm, from about 15 nm to about 100 nm, from about 15 to about 500 nm, or from about 15 to about 5000 nm, and any ranges and sub-ranges between the foregoing values. In some embodiments, each of the high RI layers 130B have an optical thickness in the range from about 2 nm to about 200 nm, from about 10 nm to about 100 nm, from about 15 nm to about 100 nm, from about 15 to about 500 nm, or from about 15 to about 5000 nm, and any ranges and sub-ranges between the foregoing values. In embodiments with a three layer period, each of the medium RI layers have an optical thickness in the range from about 2 nm to about 200 nm, from about 10 nm to about 100 nm, from about 15 nm to about 100 nm, from about 15 to about 500 nm, or from about 15 to about 5000 nm, and any ranges and sub-ranges between the foregoing values.

Figure 3:
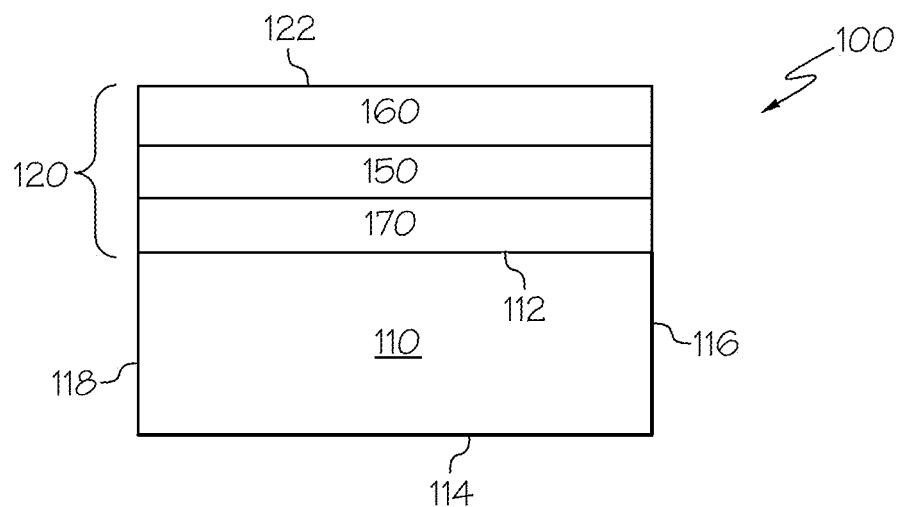
FIG. 3 is a schematic cross-sectional side view of a coated article, according to one or more embodiments described herein.
Figure 4:
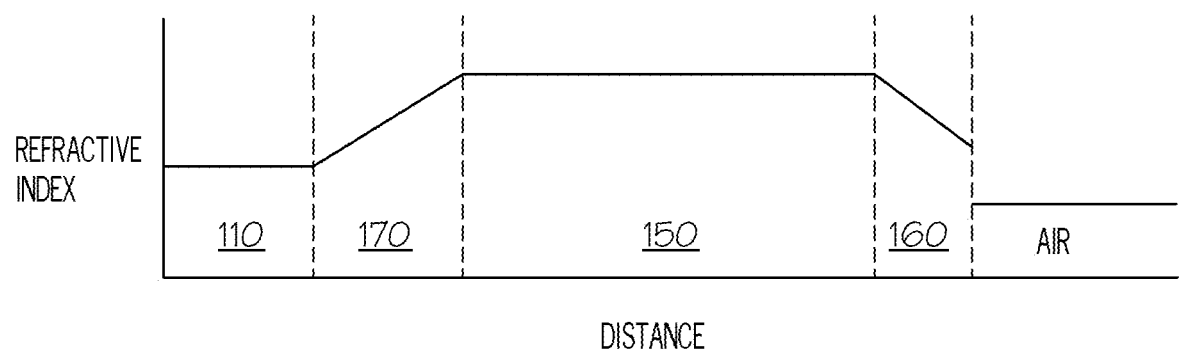
FIG. 4 graphically depicts the refractive index as a function of thickness of an optical coating, according to one or more embodiments described herein.

In one or more embodiments, the optical coating may comprise one or more gradient layers, which each may comprise a compositional gradient along their respective thicknesses, as shown in FIG. 3. In some embodiments, the optical coating 120 may comprise a bottom gradient layer 170, a scratch-resistant layer 150 (as described above), and a top gradient layer 160. FIG. 4 depicts an example refractive index profile of an optical coating 120 of FIG. 3. The substrate 110, bottom gradient layer 170, scratch-resistant layer 150, and top gradient layer 160 are marked in their corresponding portions on the refractive index profile of FIG. 4. The bottom gradient layer 170 may be positioned in direct contact with the substrate 110. The scratch-resistant layer 150 may be over the bottom gradient layer 170, and the top gradient layer may be in direct contact and over the scratch-resistant layer 150. The scratch-resistant layer 150 may comprise one or more relatively hard materials with high refractive indices, such as $SiN_x$. In embodiments, the thickness of the scratch-resistant layer 150 may be from about 300 nm to several microns, such as is described with reference to the scratch-resistant layer 150 in other embodiments. The bottom gradient layer 170 may have a refractive index which varies from about the refractive index of the substrate (which may be relatively low) in portions which contact the substrate 110 to the refractive index of the scratch-resistant layer 150 (which may be relatively high) in portions that contact the scratch-resistant layer 150. The bottom gradient layer 170 may have a thickness of from about 10 nm to several microns, such as 50 nm to 1000 nm, 100 nm to 1000 nm, or 500 nm to 1000 nm, and any ranges and sub-ranges between the foregoing values. The top gradient layer 160 may have a refractive index which varies from about the refractive index of the scratch-resistant layer 150 (which may be relatively high) at portions which contact the scratch-resistant layer 150 to a relatively low refractive index at the air interface at the air-side surface 122. The uppermost portion of the top gradient layer 160 (at the air-side surface 122) may comprise materials with a refractive index of 1.38 to 1.55, such as, but not limited to, silicate glass, silica, phosphorous glass, or magnesium fluoride.

In one or more embodiments, the refractive index of the bottom gradient layer 170 at the substrate may be within 0.2 (such as within 0.15, 0.1, 0.05, 0.02, or 0.01, and any ranges and sub-ranges between the foregoing values) of the refractive index of the substrate 110. The refractive index of the bottom gradient layer 170 at the scratch-resistant layer 150 may be within 0.2 (such as within 0.15, 0.1, 0.05, 0.02, or 0.01, and any ranges and sub-ranges between the foregoing values) of the refractive index of the scratch-resistant layer 150. The refractive index of the top gradient layer 160 at the scratch-resistant layer 150 may be within 0.2 (such as within 0.15, 0.1, 0.05, 0.02, or 0.01, and any ranges and sub-ranges between the foregoing values) of the refractive index of the scratch-resistant layer 150. The refractive index of the top gradient layer 160 at the air-side surface 122 may be from about 1.38 to about 1.55. In embodiments, the refractive index of the scratch-resistant layer may be about 1.75 or more, for example 1.8, or even 1.9, or any ranges and sub-ranges between the foregoing values.

In one or more embodiments, a single layer or multiple layers of the optical coating 120 may be deposited onto the substrate 110 by a vacuum deposition technique such as, for example, chemical vapor deposition ("CVD") (e.g., plasma enhanced CVD (PECVD), low-pressure CVD, atmospheric pressure CVD, and plasma-enhanced atmospheric pressure CVD), physical vapor deposition ("PVD") (e.g., reactive or nonreactive sputtering or laser ablation), thermal or e-beam evaporation and/or atomic layer deposition. Liquid-based methods may also be used such as spraying, dipping, spin coating, or slot coating (e.g., using sol-gel materials). Generally, vapor deposition techniques may include a variety of vacuum deposition methods which can be used to produce thin films. For example, physical vapor deposition uses a physical process (such as heating or sputtering) to produce a vapor of material, which is then deposited on the object which is coated.

In one or more embodiments, optical coating 120, or one or more layers of the optical coating 120 may have introduced residual compressive stress by utilizing particular vacuum deposition process parameters. Parameters such as deposition pressure, material composition, deposition temperature, bias of the substrate, and ion gun current are contemplated as parameters that may affect residual compressive stress of the deposited layer. It should be understood that various deposited materials may react differently to varying deposition process parameters, and that process parameters may be different for different deposited materials.

According to one or more embodiments, the pressure during deposition may affect the residual stress in the coating. In some embodiments, higher pressure may form greater tensile stress, and lower pressure during deposition may form residual compressive stress. In one or more embodiments, the residual compressive stress and/or the strain-to-failure may be increased when the pressure utilized during deposition is about 1% or more, for example 2%, 3%, 4%, 5%, 10%, 15%, or even 20%, or any ranges or sub-ranges between the foregoing values, less than normally utilized to form coatings with relatively low residual stress.

In some embodiments, the material composition of the coating may affect the residual stress of the coating. For example, AlN may typically have a tensile stress that is not suitable in some embodiments described herein. However, $Al_2O_3$ may generally have a residual compressive stress suitable for embodiments. AlON may be tuned for residual compressive stress based on the stoichiometric ratio of N to O.

In additional embodiments, the bias of the substrate during deposition may affect residual stress. For example, a negative DC bias on the substrate may promote the formation of a coating having residual compressive stress, and a positive DC bias on the substrate may promote the formation of tensile stress in the coating. Additionally, an RF bias may promote the formation of a coating with residual compressive stress.

In additional embodiments, deposition at high temperatures may promote the formation of residual compressive stress based the difference in CTE of the substrate and the coating. For example, when the substrate and coating are cooled following deposition at increased temperatures, they form residual stress depending upon the amount of cooling and the degree of CTE mismatch between the substrate and the coating.

In additional embodiments, the rate of deposition may affect the residual stress. For example, particular materials may form residual compressive stress when deposited at certain rates, and may have different residual stress when deposited at another rate.

In additional embodiments, the use of an ion gun may form residual compressive stress in the coating. Additionally, the current of a utilized ion gun may affect the residual stress. For example, higher ion gun current may form increased compressive residual stress in the coating.

In one or more embodiments, the residual compressive stress may be introduced to the optical coating by utilizing an ion-exchange process. Following deposition of the optical coating, the optical coating may be contacted by an ion-exchange bath, such as a hot salt bath. Sometimes ion-exchange may be referred to as chemical strengthening. In an ion-exchange process, smaller ions in the optical coating are replaced for larger ions in the surface of the optical coating. In one or more embodiments, the ions in the surface layer of the optical coating are replaced by—or exchanged with—larger ions having the same valence or oxidation state. Ion exchange processes are typically carried out by immersing the coated article 100 in a molten salt bath containing the larger ions to be exchanged with the smaller ions in the substrate. It will be appreciated by those skilled in the art that parameters for the ion exchange process, including, but not limited to, bath composition and temperature, immersion time, the number of immersions of the substrate in a salt bath (or baths), use of multiple salt baths, additional steps such as annealing, washing, and the like, are generally determined by the composition of the optical coating 120 and the desired residual compressive stress (CS), depth of residual compressive stress layer (or depth of layer) of the optical coating 120 that result from the strengthening operation. By way of example, ion exchange of alkali metal-containing optical coatings 120 may be achieved by immersion in at least one molten bath containing a salt such as, but not limited to, nitrates, sulfates, and chlorides of the larger alkali metal ion. The temperature of the molten salt bath typically is in a range from about 100° C. to about 1000° C., such as from about 380° C. up to about 450° C., and any ranges and sub-ranges between the foregoing values, while immersion times range from about 15 minutes up to about 40 hours, and any ranges and sub-ranges between the foregoing values. However, temperatures and immersion times different from those described above may also be used. It should be understood that the substrate 110 may be ion-exchanged in a separate step, or may be ion-exchanged in the same process step where the optical coating 120 is ion-exchanged.

According to some embodiments, the optical coating 120 may be ion-exchanged by exposing deposited films to a field-assisted ion-exchange process to achieve a larger-ion-for-smaller-ion exchange reaction within the structure of the optical coating 120. Like ion-exchange by contact with a molten salt bath, field-assisted ion-exchange processes may induce a residual compressive stress in the optical coating 120. Field-assisted ion-exchange processes include applying an electric field to the substrate with which ion-exchange is taking place to assist in the ion-exchange process. Examples of field-assisted ion-exchange processes are described in US Published Patent Application 2015/0166407 to Saxon Glass Technologies, Inc.

In one or more embodiments, the residual compressive stress may be introduced to the optical coating 120 by utilizing an ion-implantation process. Ion-implantation processing refers to a method whereby ions of a material are accelerated in an electrical field and impacted into a solid, such as the optical coating 120. The ions alter the elemental composition of the optical coating 120 (if the ions differ in composition from the optical coating 120), by stopping in the optical coating and staying there. The ions that impact the target also cause chemical and physical changes in the target by transferring their energy and momentum to the electrons and atomic nuclei of the material of the optical coating 120.

In one or more embodiments, the residual compressive stress may be introduced to the optical coating 120 by utilizing a mechanical blasting process. In some embodiments, the mechanical blasting process comprises bead-blasting or grit blasting process. However, other mechanical blasting processes are contemplated herein such as wet abrasive blasting, wheel blasting, hydro blasting, micro-abrasive blasting, and bristle blasting. According to one or more embodiments, the bead blasting process may create compression in the surface without creating cracks or flaws that are greater than about 100 nm in size.

In one or more embodiments, the residual compressive stress may be introduced to the optical coating 120 by depositing the optical coating onto a deformed substrate under physical stress and then allowing the deformed substrate to remove stress by reshaping itself (and thus introducing stress into the optical coating). A substrate 110 could be deformed by a physical force prior to and during the deposition of the optical coating 120. For example, a glass sheet may be deformed by bending the glass sheet. Then, the optical coating is deposited onto the deformed substrate 110, e.g., the bent glass sheet. Following deposition of the optical coating 120, the substrate 110 is permitted to return to its original pre-deformation shape (e.g., flat), thus introducing stress into the optical coating 120. In embodiments, the substrate may be bent to a convex or concave shape relative to the deposition surface of the substrate 110, whereby the optical coating 120 is deposited onto the convex or concave surface. When the convex or concave shape of the substrate 110 is removed (i.e., the substrate 110 returns to being a flat sheet), stresses are introduced into the optical coating 120.

In one or more embodiments, the residual compressive stress may be introduced to the optical coating by increasing the difference in CTE between the optical coating and the substrate, or increasing the coating deposition process temperature, so that residual compressive stress is increased as the coated article is cooled to room temperature. In some embodiments, the CTE of the optical coating 120 may be less that the CTE of the substrate 110. For example, in one or more embodiments, the ratio of the CTE of the substrate 110 to the CTE of at least a portion of the optical coating is about 1.2 or more, for example, 1.3, 1.4, 1.5, 1.6, 1.7, 1.8, 1.9, 2, 3, 4, or even about 5 or more, and any ranges and sub-ranges between the foregoing values. In one or more embodiments, the optical coating 120 may be deposited onto the substrate 110 at an elevated temperature (i.e., above room temperature). As the coated article 100 is cooled to room temperature, residual compressive stresses may be imparted on the optical coating 120. The CTE mismatch of the optical coating 120 and the substrate 110 may cause the formation of the residual compressive stress in the optical coating 120. In some embodiments, a portion of the optical coating 120 (such as one or more layers) may have the relatively low CTE and therefore, the residual compressive stress may be imparted on a portion of the optical coating 120. Portions of the optical coating 120 with a relatively greater CTE mismatch relative to the substrate 110 may have higher levels of residual compressive stress.

More than one technique disclosed herein may be utilized to achieve high residual compressive stress and/or strain-to-failure in the optical coating. For example, one or more of utilizing particular deposition parameters (e.g., pressure, rate, ion-assist), utilizing an ion-exchange process, utilizing an ion-implantation process, utilizing a mechanical blasting process, depositing the optical coating onto a deformed substrate under physical stress and then allowing the deformed substrate to remove stress by reshaping itself (and thus introducing stress into the optical coating), or increasing the difference in CTE between the optical coating and the substrate so that residual compressive stress is increased as the coated article is cooled to room temperature (from an elevated temperature) may be utilized in combination.

The substrate 110 may include an inorganic material and may include an amorphous substrate, a crystalline substrate or a combination thereof. The substrate 110 may be formed from man-made materials and/or naturally occurring materials (e.g., quartz and polymers). For example, in some instances, the substrate 110 may be characterized as organic and may specifically be polymeric. Examples of suitable polymers include, without limitation: thermoplastics including polystyrene (PS) (including styrene copolymers and blends), polycarbonate (PC) (including copolymers and blends), polyesters (including copolymers and blends, including polyethyleneterephthalate and polyethyleneterephthalate copolymers), polyolefins (PO) and cyclicpolyolefins (cyclic-PO), polyvinylchloride (PVC), acrylic polymers including polymethyl methacrylate (PMMA) (including copolymers and blends), thermoplastic urethanes (TPU), polyetherimide (PEI) and blends of these polymers with each other. Other exemplary polymers include epoxy, styrenic, phenolic, melamine, and silicone resins.

In some specific embodiments, the substrate 110 may specifically exclude polymeric, plastic and/or metal substrates. The substrate 110 may be characterized as alkali-including substrates (i.e., the substrate includes one or more alkalis). In one or more embodiments, the substrate exhibits a refractive index in the range from about 1.45 to about 1.55. In specific embodiments, the substrate 110 may exhibit an average strain-to-failure at a surface on one or more opposing major surface that is 0.5% or greater, 0.6% or greater, 0.7% or greater, 0.8% or greater, 0.9% or greater, 1% or greater, 1.1% or greater, 1.2% or greater, 1.3% or greater, 1.4% or greater 1.5% or greater or even 2% or greater, and any ranges and sub-ranges between the foregoing values, as measured using Ring-on-Ring Tensile Testing, using 5 samples and averaging the values from those 5 samples. A synchronized video camera was used to capture crack onset strain levels as well as catastrophic glass failure levels. In specific embodiments, the substrate 110 may exhibit an average strain-to-failure at its surface on one or more opposing major surface of about 1.2%, about 1.4%, about 1.6%, about 1.8%, about 2.2%, about 2.4%, about 2.6%, about 2.8%, or about 3% or greater, and any ranges and sub-ranges between the foregoing values.

Suitable substrates 110 may exhibit an elastic modulus (or Young's modulus) in the range from about 30 GPa to about 120 GPa, and any ranges and sub-ranges between the foregoing values. In some instances, the elastic modulus of the substrate may be in the range from about 30 GPa to about 110 GPa, from about 30 GPa to about 100 GPa, from about 30 GPa to about 90 GPa, from about 30 GPa to about 80 GPa, from about 30 GPa to about 70 GPa, from about 40 GPa to about 120 GPa, from about 50 GPa to about 120 GPa, from about 60 GPa to about 120 GPa, from about 70 GPa to about 120 GPa, and all ranges and sub-ranges therebetween.

In one or more embodiments, an amorphous substrate may include glass, which may be strengthened or non-strengthened. Examples of suitable glass include soda lime glass, alkali aluminosilicate glass, alkali containing borosilicate glass and alkali aluminoborosilicate glass. In some variants, the glass may be free of lithia. In one or more alternative embodiments, the substrate 110 may include crystalline substrates such as glass-ceramic substrates (which may be strengthened or non-strengthened) or may include a single crystal structure, such as sapphire. In one or more specific embodiments, the substrate 110 includes an amorphous base (e.g., glass) and a crystalline cladding (e.g., sapphire layer, a polycrystalline alumina layer and/or or a spinel ($MgAl_2O_4$) layer).

The substrate 110 of one or more embodiments may have a hardness that is less than the hardness of the article (as measured by the Berkovich Indenter Hardness Test described herein).

The substrate 110 may be transparent or substantially optically clear, i.e., the substrate 110 may exhibit an average light transmission over the optical wavelength regime of about 85% or greater, about 86% or greater, about 87% or greater, about 88% or greater, about 89% or greater, about 90% or greater, about 91% or greater or about 92% or greater, and any ranges and sub-ranges between the foregoing values. In one or more alternative embodiments, the substrate 110 may be opaque or exhibit an average light transmission over the optical wavelength regime of less than about 10%, less than about 9%, less than about 8%, less than about 7%, less than about 6%, less than about 5%, less than about 4%, less than about 3%, less than about 2%, less than about 1%, or less than about 0.5%, and any ranges and sub-ranges between the foregoing values. In some embodiments, these light transmittance values may be a total transmittance (taking into account transmittance of light through both major surfaces of the substrate). In some embodiments, these light reflectance values may be a total reflectance (taking into account reflectance from both major surfaces of the substrate) or may be observed on a single side of the substrate (i.e., on the air-side surface 122 only, without taking into account the opposite surface). Unless otherwise specified, the average reflectance or transmittance of the substrate alone, or the article when coated, are specified using transmittance through both major surfaces of the substrate, and using reflectance from only the coating and coated side of the substrate. Also, unless otherwise specified, the average reflectance or transmittance of the substrate alone, or of the article when coated, is measured at an incident illumination angle of 0 degrees relative to the substrate surface 112 (however, such measurements may be provided at incident illumination angles of 45 degrees or 60 degrees). The substrate 110 may optionally exhibit a color, such as white, black, red, blue, green, yellow, orange etc.

Additionally or alternatively, the physical thickness of the substrate 110 may vary along one or more of its dimensions for aesthetic and/or functional reasons. For example, the edges of the substrate 110 may be thicker as compared to more central regions of the substrate 110. The length, width and physical thickness dimensions of the substrate 110 may also vary according to the application or use of the article 100.

The substrate 110 may be provided using a variety of different processes. For instance, where the substrate 110 includes an amorphous substrate such as glass, various forming methods can include float glass processes and down-draw processes such as fusion draw and slot draw, up-draw, and press rolling.

Once formed, a substrate 110 may be strengthened to form a strengthened substrate. As used herein, the term "strengthened substrate" may refer to a substrate that has been chemically strengthened, for example through ion-exchange of larger ions for smaller ions in the surface of the substrate. However, other strengthening methods known in the art, such as thermal tempering, or utilizing a mismatch of the CTE between portions of the substrate to create compressive stress and central tension regions, may be utilized to form strengthened substrates.

Where the substrate 110 is chemically strengthened by an ion exchange process, the ions in the surface layer of the substrate are replaced by—or exchanged with—larger ions having the same valence or oxidation state. Ion exchange processes are typically carried out by immersing a substrate in a molten salt bath containing the larger ions to be exchanged with the smaller ions in the substrate. It will be appreciated by those skilled in the art that parameters for the ion exchange process, including, but not limited to, bath composition and temperature, immersion time, the number of immersions of the substrate in a salt bath (or baths), use of multiple salt baths, additional steps such as annealing, washing, and the like, are generally determined by the composition of the substrate and the desired compressive stress (CS), depth of compressive stress layer (or depth of compression, DOC) of the substrate that result from the strengthening operation. By way of example, ion exchange of alkali metal-containing glass substrates may be achieved by immersion in at least one molten bath containing a salt such as, but not limited to, nitrates, sulfates, and chlorides of the larger alkali metal ion. The temperature of the molten salt bath typically is in a range from about 380° C. up to about 450° C., and any ranges and sub-ranges between the foregoing values, while immersion times range from about 15 minutes up to about 40 hours, and any ranges and sub-ranges between the foregoing values. However, temperatures and immersion times different from those described above may also be used.

In addition, non-limiting examples of ion exchange processes in which glass substrates are immersed in multiple ion exchange baths, with washing and/or annealing steps between immersions, are described in U.S. patent application Ser. No. 12/500,650, filed Jul. 10, 2009, by Douglas C. Allan et al., entitled "Glass with Compressive Surface for Consumer Applications" and claiming priority from U.S. Provisional Patent Application No. 61/079,995, filed Jul. 11, 2008, in which glass substrates are strengthened by immersion in multiple, successive, ion exchange treatments in salt baths of different concentrations; and U.S. Pat. No. 8,312,739, by Christopher M. Lee et al., issued on Nov. 20, 2012, and entitled "Dual Stage Ion Exchange for Chemical Strengthening of Glass," and claiming priority from U.S. Provisional Patent Application No. 61/084,398, filed Jul. 29, 2008, in which glass substrates are strengthened by ion exchange in a first bath is diluted with an effluent ion, followed by immersion in a second bath having a smaller concentration of the effluent ion than the first bath. The contents of U.S. patent application Ser. No. 12/500,650 and U.S. Pat. No. 8,312,739 are incorporated herein by reference in their entirety.

The degree of chemical strengthening achieved by ion exchange may be quantified based on the parameters of central tension (CT), surface CS, and depth of compression (DOC). Surface CS may be measured near the surface or within the strengthened glass at various depths. A maximum CS value may include the measured CS at the surface ($CS_s$) of the strengthened substrate. Maximum CT values are measured using a scattered light polariscope (SCALP) technique known in the art.

Compressive stress (at the surface of the glass) is measured by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. SOC in turn is measured according to Procedure C (Glass Disc Method) described in ASTM standard C770-16, entitled "Standard Test Method for Measurement of Glass Stress-Optical Coefficient," the contents of which are incorporated herein by reference in their entirety.

As used herein, depth of compression (DOC) means the depth at which the stress in the chemically strengthened alkali aluminosilicate glass article described herein changes from compressive to tensile. DOC may be measured by FSM or by SCALP depending on the ion exchange treatment. Where the stress in the glass article is generated by exchanging potassium ions into the glass article, FSM is used to measure DOC. Where the stress is generated by exchanging sodium ions into the glass article, SCALP is used to measure DOC. Where the stress in the glass article is generated by exchanging both potassium and sodium ions into the glass, the DOC is measured by SCALP, since it is believed the exchange depth of sodium indicates the DOC and the exchange depth of potassium ions indicates a change in the magnitude of the compressive stress (but not the change in stress from compressive to tensile); the exchange depth of potassium ions in such glass articles is measured by FSM.

In some embodiments, a strengthened substrate 110 can have a surface CS of 250 MPa or greater, 300 MPa or greater, e.g., 400 MPa or greater, 450 MPa or greater, 500 MPa or greater, 550 MPa or greater, 600 MPa or greater, 650 MPa or greater, 700 MPa or greater, 750 MPa or greater or 800 MPa or greater, and any ranges and sub-ranges between the foregoing values. The strengthened substrate may have a DOC of 10 µm or greater, 15 µm or greater, 20 µm or greater (e.g., 25 µm, 30 µm, 35 µm, 40 µm, 45 µm, 50 µm or greater), and any ranges and sub-ranges between the foregoing values, and/or a CT of 10 MPa or greater, 20 MPa or greater, 30 MPa or greater, 40 MPa or greater (e.g., 42 MPa, 45 MPa, or 50 MPa or greater), and any ranges and sub-ranges between the foregoing values, but less than 100 MPa (e.g., 95, 90, 85, 80, 75, 70, 65, 60, 55 MPa or less), and any ranges and sub-ranges between the foregoing values. In one or more specific embodiments, the strengthened substrate has one or more of the following: a surface CS greater than 500 MPa, a DOC greater than 15 µm, and a CT greater than 18 MPa.

Example glasses that may be used in the substrate 110 may include alkali aluminosilicate glass compositions or alkali aluminoborosilicate glass compositions, though other glass compositions are contemplated. Such glass compositions are capable of being chemically strengthened by an ion exchange process. One example glass composition comprises $SiO_2$, $B_2O_3$ and $Na_2O$, where $(SiO_2+B_2O_3)>66$ mol. %, and $Na_2O>9$ mol. %. In some embodiments, the glass composition includes 6 wt. % or more aluminum oxide. In further embodiments, the substrate 110 includes a glass composition with one or more alkaline earth oxides, such that a content of alkaline earth oxides is 5 wt. % or more. Suitable glass compositions, in some embodiments, further comprise at least one of $K_2O$, MgO, and CaO. In some embodiments, the glass compositions used in the substrate can comprise 61-75 mol. % $SiO_2$; 7-15 mol. % $Al_2O_3$; 0-12 mol. % $B_2O_3$; 9-21 mol. % $Na_2O$; 0-4 mol. % $K_2O$; 0-7 mol. % MgO; and 0-3 mol. % CaO.

A further example glass composition suitable for the substrate comprises: 60-70 mol. % $SiO_2$; 6-14 mol. % $Al_2O_3$; 0-15 mol. % $B_2O_3$; 0-15 mol. % $Li_2O$; 0-20 mol. % $Na_2O$; 0-10 mol. % $K_2O$; 0-8 mol. % MgO; 0-10 mol. % CaO; 0-5 mol. % $ZrO_2$; 0-1 mol. % $SnO_2$; 0-1 mol. % $CeO_2$; less than 50 ppm $As_2O_3$; and less than 50 ppm $Sb_2O_3$; where 12 mol. % $(Li_2O+Na_2O+K_2O)$ 20 mol. % and 0 mol. % (MgO+CaO) 10 mol. %.

A still further example glass composition suitable for the substrate comprises: 63.5-66.5 mol. % $SiO_2$; 8-12 mol. % $Al_2O_3$; 0-3 mol. % $B_2O_3$; 0-5 mol. % $Li_2O$; 8-18 mol. % $Na_2O$; 0-5 mol. % $K_2O$; 1-7 mol. % MgO; 0-2.5 mol. % CaO; 0-3 mol. % $ZrO_2$; 0.05-0.25 mol. % $SnO_2$; 0.05-0.5 mol. % $CeO_2$; less than 50 ppm $As_2O_3$; and less than 50 ppm $Sb_2O_3$; where 14 mol. % $(Li_2O+Na_2O+K_2O)$ 18 mol. % and 2 mol. % (MgO+CaO) 7 mol. %.

In some embodiments, an alkali aluminosilicate glass composition suitable for the substrate 110 comprises alumina, at least one alkali metal and, in some embodiments, greater than 50 mol. % $SiO_2$, in other embodiments 58 mol. % $SiO_2$ or more, and in still other embodiments 60 mol. % $SiO_2$ or more, wherein the ratio $(Al_2O_3+B_2O_3)/\Sigma$modifiers (i.e., sum of modifiers) is greater than 1, where in the ratio the components are expressed in mol. % and the modifiers are alkali metal oxides. This glass composition, in particular embodiments, comprises: 58-72 mol. % $SiO_2$; 9-17 mol. % $Al_2O_3$; 2-12 mol. % $B_2O_3$; 8-16 mol. % $Na_2O$; and 0-4 mol. % $K_2O$, wherein the ratio $(Al_2O_3+B_2O_3)/\Sigma$modifiers (i.e., sum of modifiers) is greater than 1.

In some embodiments, the substrate may include an alkali aluminosilicate glass composition comprising: 64-68 mol. % $SiO_2$; 12-16 mol. % $Na_2O$; 8-12 mol. % $Al_2O_3$; 0-3 mol. % $B_2O_3$; 2-5 mol. % $K_2O$; 4-6 mol. % MgO; and 0-5 mol. % CaO, wherein: 66 mol. % $\leq SiO_2+B_2O_3+CaO \leq 69$ mol. %; $Na_2O+K_2O+B_2O_3+MgO+CaO+SrO>10$ mol. %; 5 mol. % $\leq MgO+CaO+SrO \leq 8$ mol. %; $(Na_2O+B_2O_3)-Al_2O_3 \leq 2$ mol. %; 2 mol. % $\leq Na_2O-Al_2O_3 \leq 6$ mol. %; and 4 mol. % $\leq (Na_2O+K_2O)-Al_2O_3 \leq 10$ mol. %.

In some embodiments, the substrate 110 may comprise an alkali aluminosilicate glass composition comprising: 2 mol % or more of $Al_2O_3$ and/or $ZrO_2$, or 4 mol % or more of $Al_2O_3$ and/or $ZrO_2$.

Where the substrate 110 includes a crystalline substrate, the substrate may include a single crystal, which may include $Al_2O_3$. Such single crystal substrates are referred to as sapphire. Other suitable materials for a crystalline substrate include polycrystalline alumina layer and/or spinel ($MgAl_2O_4$).

Optionally, the substrate 110 may include a glass-ceramic substrate, which may be strengthened or non-strengthened. Glass-ceramics" include materials produced through controlled crystallization of glass. In embodiments, glass-ceramics have about 30% to about 90% crystallinity. Examples of suitable glass-ceramics may include $Li_2O$—$Al_2O_3$—$SiO_2$ system (i.e. LAS-System) glass-ceramics, MgO—$Al_2O_3$—$SiO_2$ system (i.e. MAS-System) glass-ceramics, and/or glass-ceramics that include a predominant crystal phase including β-quartz solid solution, β-spodumene, cordierite, and lithium disilicate. The glass-ceramic substrates may be strengthened using the chemical strengthening processes disclosed herein. In one or more embodiments, MAS-System glass-ceramic substrates may be strengthened in $Li_2SO_4$ molten salt, whereby an exchange of $2Li^+$ for $Mg^{2+}$ can occur.

The substrate 110 according to one or more embodiments can have a physical thickness ranging from about 100 µm to about 5 mm, and any ranges and sub-ranges between the foregoing values, in various portions of the substrate 110. In some embodiments, the substrate 110 physical thicknesses ranges from about 100 µm to about 500 µm (e.g., 100, 200, 300, 400 or 500 µm). In some embodiments, the substrate 110 physical thicknesses ranges from about 500 µm to about 1000 µm (e.g., 500, 600, 700, 800, 900 or 1000 µm), and any ranges and sub-ranges between the foregoing values. In some embodiments, substrate 110 may have a physical thickness greater than about 1 mm (e.g., about 2, 3, 4, or 5 mm). The substrate 110 may be acid polished or otherwise treated to remove or reduce the effect of surface flaws.

According to one or more embodiments described herein, a coated article 100, an optical coating 120, or an individual layer of an optical coating 100 may have a strain-to-failure (i.e., a crack onset strain) of greater than or equal to about 0.4%, greater than or equal to about 0.5%, greater than or equal to about 0.6%, greater than or equal to about 0.7%, greater than or equal to about 0.8%, greater than or equal to about 0.9%, greater than or equal to about 1.0%, greater than or equal to about 1.5%, or even greater than or equal to about 2.0%, and any ranges and sub-ranges between the foregoing values. The term "strain-to-failure" refers to the strain at which cracks propagate in the optical coating 120, substrate 110, or both simultaneously without application of additional load, typically leading to catastrophic failure in a given material, layer or film and, perhaps even bridge to another material, layer, or film, as defined herein. That is, breakage of the optical coating 120 without breakage of the substrate constitutes failure, and breakage of the substrate 110 also constitutes failure. The term "average" when used in connection with average strain-to-failure or any other property is based on the mathematical average of measurements of such property on 5 samples. Typically, crack onset strain measurements are repeatable under normal laboratory conditions, and the standard deviation of crack onset strain measured in multiple samples may be as little as 0.01% of observed strain. Average strain-to-failure as used herein was measured using Ring-on-Ring Tensile Testing. However, unless stated otherwise, strain-to-failure measurements described herein refer to measurements from the ring-on-ring testing device described herein below.

Figure 5:
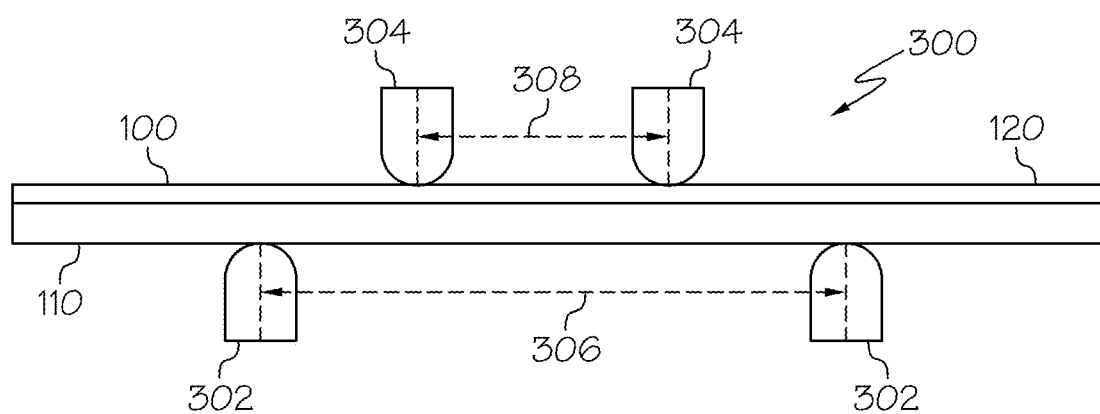
FIG. 5 schematically depicts a cross-sectional side view of a ring-on-ring mechanical testing device utilized to measure the strain-to-failure for a coated article, according to one or more embodiments described herein.

FIG. 5 schematically depicts a cross-sectional view of a ring-on-ring mechanical testing device 300 utilized to measure the strain-to-failure for a coated article 100. According to the Ring-on-Ring Tensile Testing Procedure, the coated article 100 is positioned between the bottom ring 302 and the top ring 304. The top ring 304 and the bottom ring 302 have different diameters, where the diameter of the top ring 304 is represented by dashed line 308 and the diameter of the bottom ring 302 is represented by dashed line 306. As used herein, the top ring 304 has a diameter 308 of 12.7 mm and the bottom ring 302 has a diameter 306 of 25.4 mm. The portion of the top ring 304 and bottom ring 302 which contact the coated article 100 are circular in cross section and each have radius of 1.6 mm. The top ring 304 and bottom ring 302 are made of steel. Testing is performed in an environment of about 22° C. with 45%-55% relative humidity. The coated articles used for testing are 50 mm by 50 mm squares in size.

Figure 6:
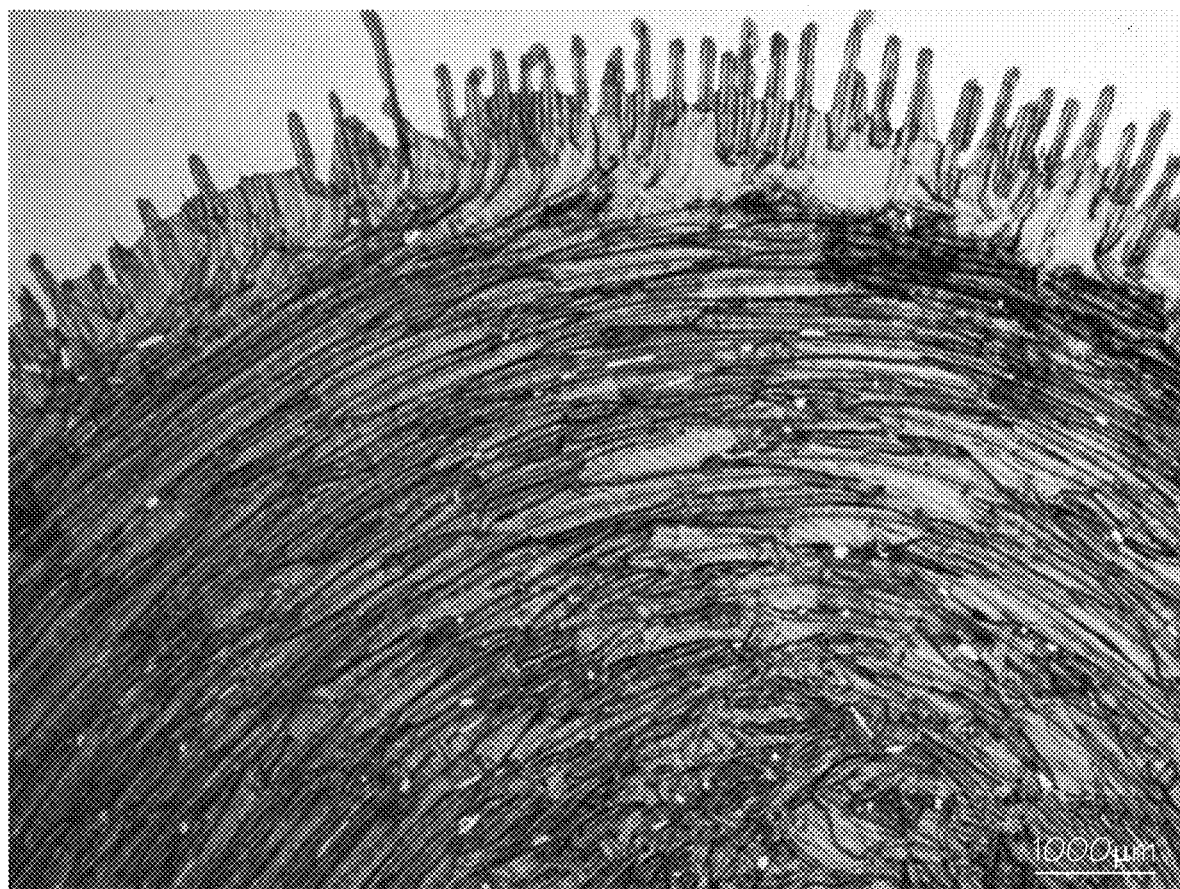
FIG. 6 depicts a photographic image of a coated article following a Ring-on-Ring Tensile Testing Procedure with optical coating failure, according to one or more embodiments described herein.

To determine the strain-to-failure of the coated article 100, force is applied to the top ring 304 in a downward direction and/or to the bottom ring in an upward direction as orientation is shown in FIG. 5. The force on the top ring 304 and or bottom ring 302 is increased, causing strain in the coated article 100 until catastrophic failure of one or both of the substrate 110 and the optical coating 120. A light and camera (not depicted in FIG. 5) is provided below the bottom ring 30 to record the catastrophic failure during testing. An electronic controller, such as a Dewetron acquisition system, is provided to coordinate the camera images with the applied load to determine the load when catastrophic damage is observed by the camera. FIG. 6 depicts an image of example failure in a Ring-on-Ring Tensile Testing Procedure. To determine the strain-to-failure, camera images and load signals are synchronized through the Dewetron system, so that the load at which the coating shows failure can be determined. Then, the finite element analysis, as found in "Hu, G., et al., *Dynamic fracturing of strengthened glass under biaxial tensile loading*. Journal of Non-Crystalline Solids, 2014. 405(0): p. 153-158.)", is used to analyze the strain levels the sample is experiencing at this load. The element size may be chosen to be fine enough to be representative of the stress concentration underneath the loading ring. The strain level is averaged over 30 nodal points or more underneath the loading ring.

The optical coating 120 and/or the article 100 may be described in terms of a hardness and/or Young's modulus measured by a Berkovich Indenter Hardness Test. As used herein, the "Berkovich Indenter Hardness Test" includes measuring the Young's modulus of the thin film elements on a proxy layer. The proxy layer was made of the same material and was deposited by the same process used to generate the coating, but was deposited 300 nm thick onto a Gorilla® Glass substrate. Hardness and Young's modulus of thin film coatings are determined using widely accepted nano-indentation practices. See: Fischer-Cripps, A. C., Critical Review of Analysis and Interpretation of Nanoindentation Test Data, Surface & Coatings Technology, 200, 4153-4165 (2006) (hereinafter "Fischer-Cripps"); and Hay, J., Agee, P, and Herbert, E., Continuous Stiffness measurement During Instrumented Indentation Testing, Experimental Techniques, 34 (3) 86-94 (2010) (hereinafter "Hay"). For coatings, it is typical to measure hardness and modulus as a function of indentation depth. So long as the coating is of sufficient thickness, it is then possible to isolate the properties of the coating from the resulting response profiles. It should be recognized that if the coatings are too thin (for example, less than ~500 nm), it may not be possible to completely isolate the coating properties as they can be influenced from the proximity of the substrate which may have different mechanical properties. See Hay. The methods used to report the properties herein are representative of the coatings themselves. The process is to measure hardness and modulus versus indentation depth out to depths approaching 1000 nm. In the case of hard coatings on a softer glass, the response curves will reveal maximum levels of hardness and modulus at relatively small indentation depths (</=about 200 nm). At deeper indentation depths both hardness and modulus will gradual diminish as the response is influenced by the softer glass substrate. In this case the coating hardness and modulus are taken be those associated with the regions exhibiting the maximum hardness and modulus. In the case of soft coatings on a harder glass substrate, the coating properties will be indicated by lowest hardness and modulus levels that occur at relatively small indentation depths. At deeper indentation depths, the hardness and modulus will gradually increase due to the influence of the harder glass. These profiles of hardness and modulus versus depth can be obtained using either the traditional Oliver and Pharr approach (as described in Fischer-Cripps) or by the more efficient continuous stiffness approach (see Hay). Extraction of reliable nano-indentation data requires that well-established protocols be followed. Otherwise, these metrics can be subject to significant errors. These elastic modulus and hardness values are measured for such thin films using known diamond nano-indentation methods, as described above, with a Berkovich diamond indenter tip.

Typically, in nano-indentation measurement methods (such as by using a Berkovich indenter) where the coating is harder than the underlying substrate, the measured hardness may appear to increase initially due to development of the plastic zone at shallow indentation depths (e.g., less than 25 nm or less than 50 nm) and then increases and reaches a maximum value or plateau at deeper indentation depths (e.g., from 50 nm to about 500 nm or 1000 nm). Thereafter, hardness begins to decrease at even deeper indentation depths due to the effect of the underlying substrate when the substrate is softer than the coating. Where a substrate having a greater hardness compared to the coating is utilized, the same effect can be seen; however, the hardness increases at deeper indentation depths due to the effect of the underlying substrate.

The indentation depth range and the hardness values at certain indentation depth ranges can be selected to identify a particular hardness response of the optical coatings 120 and layers thereof, described herein, without the effect of the underlying substrate 110. When measuring hardness of the optical coating 120 (when disposed on a substrate 110) with a Berkovich indenter, the region of permanent deformation (plastic zone) of a material is associated with the hardness of the material. During indentation, an elastic stress field extends well beyond this region of permanent deformation. As indentation depth increases, the apparent hardness and modulus are influenced by stress field interactions with the underlying substrate 110. The influence of the substrate on hardness occurs at deeper indentation depths (i.e., typically at depths greater than about 10% of the optical coating 120). Moreover, a further complication is that the hardness response is developed by a certain minimum load to develop full plasticity during the indentation process. Prior to that certain minimum load, the hardness shows a generally increasing trend.

At small indentation depths (which also may be characterized as small loads) (e.g., up to about 50 nm), the apparent hardness of a material appears to increase dramatically versus indentation depth. This small indentation depth regime does not represent a true metric of hardness but, instead, reflects the development of the aforementioned plastic zone, which is related to the finite radius of curvature of the indenter. At intermediate indentation depths, the apparent hardness approaches maximum levels. At deeper indentation depths, the influence of the substrate becomes more pronounced as the indentation depths increase. Hardness may begin to drop dramatically once the indentation depth exceeds about 30% of the optical coating thickness.

In one or more embodiments, the coated article 100 may exhibit a hardness of about 5 GPa or greater, about 8 GPa or greater, about 10 GPa or greater or about 12 GPa or greater (e.g., 14 GPa or greater, 16 GPa or greater, 18 GPa or greater, or even 20 GPa or greater), and any ranges and sub-ranges between the foregoing values, as measured on the air-side surface 122, by a Berkovich Indenter Hardness Test. In one or more embodiments, the optical coating 120 may exhibit a maximum hardness of about 8 GPa or greater, about 10 GPa or greater, or about 12 GPa or greater (e.g., 14 GPa or greater, 16 GPa or greater, 18 GPa or greater, or even 20 GPa or greater), and any ranges and sub-ranges between the foregoing values as measured on the air-side surface 122 by a Berkovich Indenter Hardness Test. In some embodiments, the maximum hardness of the high RI layer and/or the scratch-resistant layer 150, as measured by the Berkovich Indenter Hardness Test, may be about 8 GPa or greater, about 10 GPa or greater, about 12 GPa or greater, about 15 GPa or greater, about 18 GPa or greater, or even about 20 GPa or greater, and any ranges and sub-ranges between the foregoing values. Measurement of a single layer can be conducted by applying the single layer to the article and testing for maximum Berkovich hardness. Such measured hardness values may be exhibited by the coated article 100, optical coating 120, high RI layer 130B, and/or scratch-resistant layer 150 along an indentation depth of about 50 nm or greater or about 100 nm or greater (e.g., from about 100 nm to about 300 nm, from about 100 nm to about 400 nm, from about 100 nm to about 500 nm, from about 100 nm to about 600 nm, from about 200 nm to about 300 nm, from about 200 nm to about 400 nm, from about 200 nm to about 500 nm, or from about 200 nm to about 600 nm), and any ranges and sub-ranges between the foregoing values. In one or more embodiments, the article exhibits a hardness that is greater than the hardness of the substrate (which can be measured on the opposite surface from the air-side surface 122).

Optical interference between reflected waves from the optical coating 120/air interface and the optical coating 120/substrate 110 interface can lead to spectral reflectance and/or transmittance oscillations that create apparent color in the article 100. As used herein, the term "transmittance" is defined as the percentage of incident optical power within a given wavelength range transmitted through a material (e.g., the article, the substrate or the optical film or portions thereof). The term "reflectance" is similarly defined as the percentage of incident optical power within a given wavelength range that is reflected from a material (e.g., the article, the substrate, or the optical film or portions thereof). As used herein, an "average transmission" refers to the average amount of incident optical power transmitted through a material over a defined optical wavelength regime. As used herein, an "average reflectance" refers to the average amount of incident optical power reflected by the material. Reflectance may be measured as a single side reflectance when measured at the air-side surface 122 only (e.g., when removing the reflections from an uncoated back surface (e.g., 114 in FIG. 1) of the coated article 100, such as through using index-matching oils on the back surface coupled to an absorber, or other known methods). In one or more embodiments, the spectral resolution of the characterization of the transmittance and reflectance is less than 5 nm or 0.02 eV. The color may be more pronounced in reflection. The angular color may shift in reflection with viewing angle due to a shift in the spectral reflectance oscillations with incident illumination angle. Angular color shifts in transmittance with viewing angle are also due to the same shift in the spectral transmittance oscillation with incident illumination angle. The observed color and angular color shifts with incident illumination angle are often distracting or objectionable to device users, particularly under illumination with sharp spectral features such as fluorescent lighting and some LED lighting. Angular color shifts in transmission may also play a factor in color shift in reflection and vice versa. Factors in angular color shifts in transmission and/or reflection may also include angular color shifts due to viewing angle or angular color shifts away from a certain white point that may be caused by material absorption (somewhat independent of angle) defined by a particular illuminant or test system.

The articles described herein exhibit an average light transmission and a single side average light reflectance over a specified wavelength ranges in or near the visible spectrum. Additionally, the articles described herein exhibit an average visible photopic transmittance and an average visible photopic reflectance over a specified wavelength range in the visible spectrum. In embodiments, the wavelength ranges (sometimes referred to herein as an "optical wavelength regime") for measuring average light transmission, single side average light reflectance, average visible photopic transmission, and average visible photopic reflectance are from about 450 nm to about 650 nm, from about 420 nm to about 680 nm, from about 420 nm to about 700 nm, from about 420 nm to about 740 nm, from about 420 nm to about 850 nm, from about 420 nm to about 950 nm, or preferably from about 350 nm to about 850 nm. Unless otherwise specified, the average light transmission, single side average light reflectance, average visible photopic transmission, and average visible photopic reflectance are measured at an incident illumination angle near normal to the anti-reflective surface 122, such as at an angle of incidence of from about 0 degrees to about 10 degrees (however, such measurements may be collected at other incident illumination angles, such as, e.g., 30 degrees, 45 degrees, or 60 degrees).

In one or more embodiments, a coated article 100 may exhibit an average single side light reflectance of about 50% or less, 40% or less, 30% or less, 20% or less, 10% or less, 9% or less, about 8% or less, about 7% or less, about 6% or less, about 5% or less, about 4% or less, about 3% or less, or even about 2% or less, and any ranges and sub-ranges between the foregoing values, over the optical wavelength regime, when measured at the air-side surface 122 only (e.g., when removing the reflections from an uncoated back surface of the article, such as through using index-matching oils on the back surface coupled to an absorber). In some embodiments, the average single side light reflectance may be in the range from about 0.4% to about 9%, from about 0.4% to about 8%, from about 0.4% to about 7%, from about 0.4% to about 6%, or from about 0.4% to about 5%, and any ranges and sub-ranges between the foregoing values. In one or more embodiments, the coated article 100 exhibits an average light transmission of about 50% or greater, 60% or greater, 70% or greater, 80% or greater, 90% or greater, 92% or greater, 94% or greater, 96% or greater, 98% or greater, or 99% or greater, and any ranges and sub-ranges between the foregoing values, over an optical wavelength regime. In embodiments, the coated article 100 may exhibit a light transmission in the range from about 99.5 to about 90%, 92%, 94%, 96%, 98%, or 99%, and any ranges and sub-ranges between the foregoing values.

In some embodiments, the coated article 100 may exhibit an average visible photopic reflectance of about 50% or less, 40% or less, 30% or less, 20% or less, 10% or less, about 9% or less, about 8% or less, about 7% or less, about 6% or less, about 5% or less, about 4% or less, about 3% or less, about 2% or less, about 1% or less, or even about 0.8% or less, and any ranges and sub-ranges between the foregoing values, over an optical wavelength regime. As used herein, photopic reflectance mimics the response of the human eye by weighting the reflectance versus wavelength spectrum according to the human eye's sensitivity. Photopic reflectance may also be defined as the luminance, or tristimulus Y value of reflected light, according to known conventions such as CIE color space conventions. The average photopic reflectance is defined in the below equation as the spectral reflectance, $R(\lambda)$ multiplied by the illuminant spectrum, $I(\lambda)$ and the CIE's color matching function $\bar{y}(\lambda)$, related to the eye's spectral response $$\langle R_p \rangle = \int_{380\,nm}^{720\,nm} R(\lambda) \times I(\lambda) \times \bar{y}(\lambda) d\lambda$$

In some embodiments, the article 100 may exhibit an average visible photopic transmission of about 50% or greater, 60% or greater, 70% or greater, 80% or greater, about 85% or greater, about 90% or greater, about 92% or greater, about 94% or greater, about 96% or greater, or even about 98% or greater, and any ranges and sub-ranges between the foregoing values, over an optical wavelength regime. Similarly, photopic transmission can be determined by the equation:

$$\langle T_p \rangle = \int_{380\,nm}^{720\,nm} T(\lambda) \times I(\lambda) \times \bar{y}(\lambda) d\lambda$$

In one or more embodiments, the coated article 100 exhibits a measurable color (or lack thereof) in reflectance and transmittance in the CIE L*a*b* colorimetry system (referred to herein as a "color coordinate"). The transmittance color coordinates refer to the observed L*a*b* color coordinates in transmittance and the reflectance color coordinates refer to the observed L*a*b* color coordinates in reflectance. The transmittance color coordinates or reflectance color coordinates may be measured under a variety of illuminant light types, which may include standard illuminants as determined by the CIE, including A illuminants (representing tungsten-filament lighting), B illuminants (daylight simulating illuminants), C illuminants (daylight simulating illuminants), D series illuminants (representing natural daylight), and F series illuminants (representing various types of fluorescent lighting)). Specific illuminants include F2, F10, F11, F12 or D65, as defined by CIE. Additionally, the reflectance color coordinates and transmittance color coordinates may be measured at different observed angles of incidence, such as normal (0 degrees), 5 degrees, 10 degrees, 15 degrees, 30 degrees, 45 degrees, or 60 degrees.

In one or more embodiments, the coated article 100 has a* of less than or equal to about 10, 8, 6, 5, 4, 3, 2, or even 1, and any ranges and sub-ranges between the foregoing values, in transmittance and/or reflectance when viewed at a normal angle of incidence, or an angle of incidence of 5 degrees, 10 degrees, 15 degrees, 30 degrees, 45 degrees, or 60 degrees. In one or more embodiments, the coated article 100 has b* of less than or equal to about 10, 8, 6, 5, 4, 3, 2, or even 1, and any ranges and sub-ranges between the foregoing values, in transmittance and/or reflectance when viewed at a normal angle of incidence, or an angle of incidence of 5 degrees, 10 degrees, 15 degrees, 30 degrees, 45 degrees, or 60 degrees. In one or more embodiments, the coated article 100 has a* of greater than or equal to about −10, −8, −6, −5, −4, −3, −2, or even −1, and any ranges and sub-ranges between the foregoing values, in transmittance and/or reflectance when viewed at a normal angle of incidence, or an angle of incidence of 5 degrees, 10 degrees, 15 degrees, 30 degrees, 45 degrees, or 60 degrees. In one or more embodiments, the coated article 100 has b* of greater than or equal to about −10, −8, −6, −5, −4, −3, −2, or even −1, and any ranges and sub-ranges between the foregoing values, in transmittance and/or reflectance when viewed at a normal angle of incidence, or an angle of incidence of 5 degrees, 10 degrees, 15 degrees, 30 degrees, 45 degrees, or 60 degrees.

In one or more embodiments, a reference point color shift may be measured between a reference point and the transmittance color coordinates or reflectance color coordinates. The reference point color shift measures the difference in color between a reference point color coordinate and an observed color coordinate (either reflected or transmitted). The reflectance reference point color shift (sometimes referred to as the reference point color shift in reflectance) refers to the difference between the reflected color coordinate and the reference point. The transmittance reference point color shift (sometimes referred to as the reference point color shift in transmittance) refers to the difference between the transmitted color coordinates and the reference point. To determine the reference point color shift, a reference point is chosen. According to embodiments described herein, the reference point may be the origin in the CIE L*a*b* colorimetry system (the color coordinates a*=0, b*=0), the coordinates (a*=−2, b*=−2), or the transmittance or reflectance color coordinates of the substrate. It should be understood that unless otherwise noted, the L* coordinate of the articles described herein are the same as the reference point and do not influence color shift. Where the reference point color shift of the article is defined with respect to the substrate, the transmittance color coordinates of the article are compared to the transmittance color coordinates of the substrate and the reflectance color coordinates of the article are compared to the reflectance color coordinates of the substrate. Unless otherwise noted, the reference point color shift refers to the shift measured between the reference point and the color coordinate in transmittance or reflectance as measured at a normal angle relative to the air-side surface 122 of the coated article 100. However, it should be understood that the reference point color shift may be determined based on non-normal angles of incidence, such as 5 degrees, 10 degrees, 15 degrees, 30 degrees, 45 degrees, or 60 degrees. Additionally, unless otherwise noted, the reflectance color coordinates are measured on only the air-side surface 122 of the article. However, the reflectance color coordinates described herein can be measured on both the air-side surface 122 of the article and the opposite side of the article (i.e., major surface 114 in FIG. 1) using either a 2-surface measurement (reflections from two sides of an article are both included) or a 1-surface measurement (reflection from only the air-side surface 122 of the article is measured). Of these, the 1-surface reflectance measurement is typically the more challenging metric to achieve low reference point color shift values for anti-reflective coatings, and this has relevance to applications (such as smartphones, etc.) where the back surface of the article is bonded to a light absorbing medium such as black ink or an LCD or OLED device).

Where the reference point is the color coordinates $a^*=0$, $b^*=0$ (the origin), the reference point color shift is calculated by the following equation: reference point color shift=$\sqrt{((a^*_{article})^2+(b^*_{article})^2)}$.

Where the reference point is the color coordinates $a^*=-2$, $b^*=-2$, the reference point color shift is calculated by the following equation: reference point color shift=$\sqrt{((a^*_{article}+2)^2 (b^*_{article}+2)^2)}$.

Where the reference point is the color coordinates of the substrate, the reference point color shift is calculated by the following equation: reference point color shift=$\sqrt{((a^*_{article}-a^*_{substrate}) (b^*_{article} b^*_{substrate})^2)}$.

In one or more embodiments, the reference point color shift in reflectance and/or transmittance is less than about 10, less than about 9, less than about 8, less than about 7, less than about 6, less than about 5, less than about 4, less than about 3, less than about 2.5, less than about 2, less than about 1.8, less than about 1.6, less than about 1.4, less than about 1.2, less than about 1, less than about 0.8, less than about 0.6, less than about 0.4, or even less than about 0.25, and any ranges and sub-ranges between the foregoing values, as measured relative to one of the disclosed reference points.

Some embodiments of this disclosure pertain to a coated article 100 that exhibits colorlessness in reflectance and/or transmittance even when viewed at a non-normal angle of incidence under an illuminant. In one or more embodiments, the coated articles 100 described herein may have a minimal change in visible color in reflectance and/or transmission when the viewing angle is changed. Such can be characterized by the angular color shift of a coated article 100 in reflectance or transmittance. Angular color shift may be determined using the following equation, where: angular color shift=$\sqrt{((a^*_2-a^*_1)^2+(b^*_2-b^*_1)^2)}$. In the angular color shift equation, $a^*i$, and $b^*i$ represent the $a^*$ and $b^*$ coordinates of the article when viewed at an incidence reference illumination angle (which may include normal incidence) and $a^*2$, and $b^*2$ represent the $a^*$ and $b^*$ coordinates of the article when viewed at an incident illumination angle, provided that the incident illumination angle is different from the reference illumination angle and in some cases differs from the reference illumination angle by about 1 degree or more, for example 2 degrees or about 5 degrees. It should be understood that unless otherwise noted, the L* coordinate of the articles described herein are the same at any angle or reference point and do not influence color shift.

The reference illumination angle may include normal incidence (i.e., 0 degrees), or, for example, 5 degrees, 10 degrees, 15 degrees, 30 degrees, 45 degrees, or 60 degrees from normal incidence. However, unless stated otherwise, the reference illumination angle is a normal angle of incidence. The incident illumination angle may be, for example, about 5 degrees, 10 degrees, 15 degrees, 30 degrees, 45 degrees, or 60 degrees from the reference illumination angle.

In one or more embodiments, the coated article 100 has an angular color shift in reflectance and/or transmittance of about 10 or less (e.g., 5 or less, 4 or less, 3 or less, or 2 or less, and any ranges and sub-ranges between the foregoing values) when viewed at a particular incident illumination angle different from a reference illumination angle, under an illuminant. In some embodiments, the angular color shift in reflectance and/or transmittance is about 1.9 or less, 1.8 or less, 1.7 or less, 1.6 or less, 1.5 or less, 1.4 or less, 1.3 or less, 1.2 or less, 1.1 or less, 1 or less, 0.9 or less, 0.8 or less, 0.7 or less, 0.6 or less, 0.5 or less, 0.4 or less, 0.3 or less, 0.2 or less, or 0.1 or less, and any ranges and sub-ranges between the foregoing values. In some embodiments, the angular color shift may be about 0. The illuminant can include standard illuminants as determined by the CIE, including A illuminants (representing tungsten-filament lighting), B illuminants (daylight simulating illuminants), C illuminants (daylight simulating illuminants), D series illuminants (representing natural daylight), and F series illuminants (representing various types of fluorescent lighting). In specific examples, the articles exhibit an angular color shift in reflectance and/or transmittance of about 2 or less when viewed at incident illumination angle from the reference illumination angle under a CIE F2, F10, F11, F12 or D65 illuminant, or more specifically, under a CIE F2 illuminant.

In one or more embodiments, the coated article 100 has an angular color shift in reflectance and/or transmittance of about 10 or less (e.g., 5 or less, 4 or less, 3 or less, or 2 or less) at all incident illumination angles in a given range relative to the reference illumination angle. For example, the coated article 100 may have an angular color shift of about 10 or less, 5 or less, 4 or less, 3 or less, or 2 or less at all incident illumination angles in a range from the reference illumination angle to about 5 degrees, 10 degrees, 15 degrees, 30 degrees, 45 degrees, or 60 degrees from the reference illumination angle. In additional embodiments, the coated article 100 may have an angular color shift of about 1.9 or less, 1.8 or less, 1.7 or less, 1.6 or less, 1.5 or less, 1.4 or less, 1.3 or less, 1.2 or less, 1.1 or less, 1 or less, 0.9 or less, 0.8 or less, 0.7 or less, 0.6 or less, 0.5 or less, 0.4 or less, 0.3 or less, 0.2 or less, or 0.1 or less, and any ranges and sub-ranges between the foregoing values, at all incident illumination angles in a range from the reference illumination angle to about 5 degrees, 10 degrees, 15 degrees, 30 degrees, 45 degrees, or 60 degrees from the reference illumination angle.

In one or more embodiments, the coated article 100 exhibits a haze value of about 10% of less, as measured on the abraded side using a hazemeter supplied by BYK Gardner under the trademark Haze-Gard Plus®, using an aperture over the source port, the aperture having a diameter of 8 mm. In some embodiments, the haze may be about 50% or less, about 25% or less, about 20% or less, about 15% or less, about 10% or less, about 9% or less, about 8% or less, about 7% or less, about 6% or less, about 5% or less, about 4% or less, about 3% or less, about 2% or less, about 1% or less, about 0.5% or less or about 0.3% or less, and any ranges and sub-ranges between the foregoing values. In some specific embodiments, the article 100 exhibits a haze in the range from about 0.1% to about 10%, from about 0.1% to about 9%, from about 0.1% to about 8%, from about 0.1% to about 7%, from about 0.1% to about 6%, from about 0.1% to about 5%, from about 0.1% to about 4%, from about 0.1% to about 3%, from about 0.1% to about 2%, from about 0.1% to about 1%, 0.3% to about 10%, from about 0.5% to about 10%, from about 1% to about 10%, from about 2% to about 10%, from about 3% to about 10%, from about 4% to about 10%, from about 5% to about 10%, from about 6% to about 10%, from about 7% to about 10%, from about 1% to about 8%, from about 2% to about 6%, from about 3% to about 5%, and all ranges and sub-ranges therebetween.

Figure 7A:
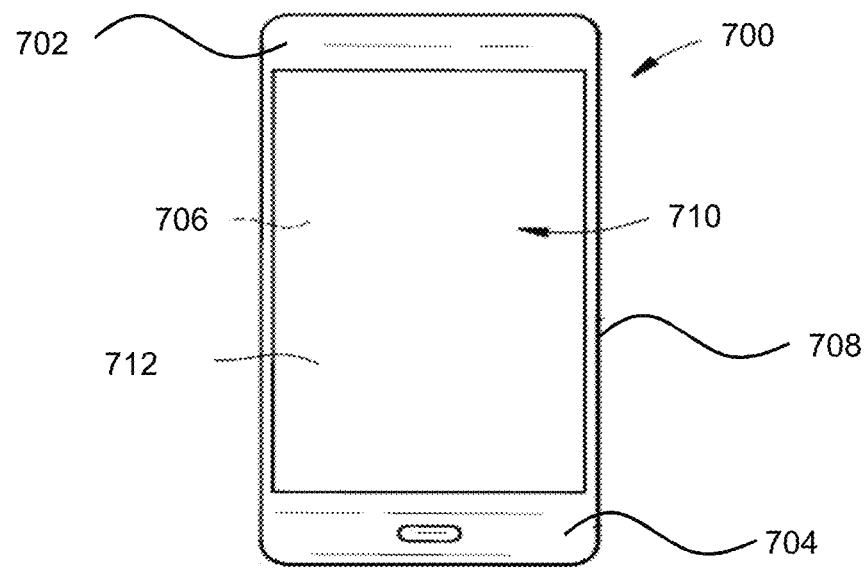
FIG. 7A is a plan view of an exemplary electronic device incorporating any of the articles disclosed herein.
Figure 7B:
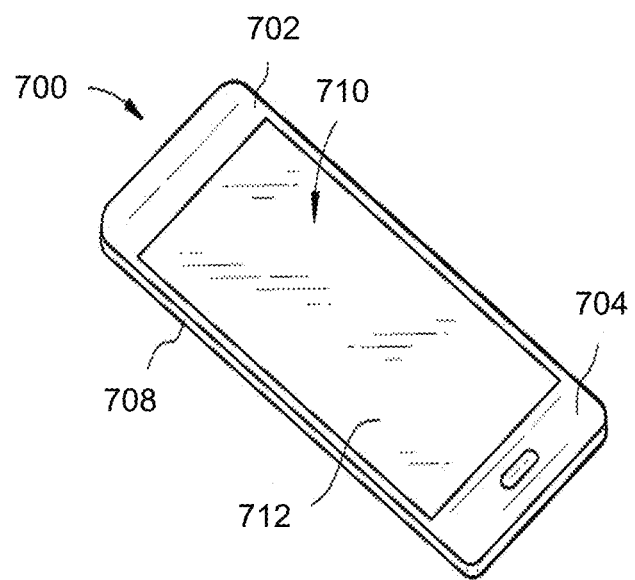
FIG. 7B is a perspective view of the exemplary electronic device of FIG. 7A.

The coated articles disclosed herein may be incorporated into another article such as an article with a display (or display articles) (e.g., consumer electronics, including mobile phones, tablets, computers, navigation systems, wearable devices (e.g., watches) and the like), architectural articles, transportation articles (e.g., automotive, trains, aircraft, sea craft, etc.), appliance articles, or any article that requires some transparency, scratch-resistance, abrasion resistance or a combination thereof. An exemplary article incorporating any of the coated articles disclosed herein is shown in FIGS. 7A and 7B. Specifically, FIGS. 7A and 7B show a consumer electronic device 700 including a housing 702 having front 704, back 706, and side surfaces 708; electrical components (not shown) that are at least partially inside or entirely within the housing and including at least a controller, a memory, and a display 710 at or adjacent to the front surface of the housing; and a cover substrate 712 at or over the front surface of the housing such that it is over the display. In some embodiments, the cover substrate 712 may include any of the coated articles disclosed herein. In some embodiments, at least one of a portion of the housing or the cover glass comprises the coated articles disclosed herein.

EXAMPLES

The various embodiments of coated articles will be further clarified by the following examples. The examples are illustrative in nature, and should not be understood to limit the subject matter of the present disclosure.

Example 1

Films were deposited onto glass substrates by plasma deposition. Films were deposited onto Gorilla® Glass (Corning code #5318 having a CS of about 850 MPa, and a DOC of about 40 microns, and a thickness of 1.0 millimeter (mm)) using reactive sputtering deposition. The sputtering targets were 3 inch diameter targets of silicon and aluminum. Each target had a pneumatically driven shutter which could either prevent deposition of the sputtered material when the shutter was closed, or allow deposition of the sputtered material onto the substrates when the shutter was opened. The samples are located above the sputtering targets. The sputtering throw distance in the chamber was about 100 mm. The samples were rotated above the sputtering targets in order to improve uniformity. A thermocouple disposed near the substrate holder was used for monitoring temperature near (~1 mm away) the substrate. The samples were heated and controlled to hold at 200° C. inside the chamber prior to, and during deposition. The chamber used a variable angle gate valve for controlling the pressure. This variable angle valve is a convenience, but is not required to achieve the film properties that are disclosed herein. The deposition chamber used a load lock for transport of the samples into the chamber. The chamber was pumped via a turbomolecular pump. The base pressure of the chamber was about 0.1 microtorr (i.e. 1e-7 torr).

A deposition run was started by loading the samples into the load lock, pumping down the load lock, and then transferring the samples into the deposition chamber. A flow of argon gas was started in the deposition chamber and the variable angle gate valve was used to control the pressure to about 30 millitorr. After a pressure of about 30 millitorr stabilized, a plasma was then started at each of the sputter targets that were intended to be used for the coating run. The plasma was driven by either or both of DC and RF (13.56 MHz) power. Typically there was used 300 watts of DC superimposed with 200 watts of RF on a 99.99% pure aluminum target, and 500 watts of DC on the p-doped Si target, but variations are shown in Table 1. Subsequent experiments have found that the Al could also be driven with 500 watts of DC alone, with no superimposed RF. After the plasma stabilized for about a minute, the pressure was reduced to a deposition pressure using the variable angle gate valve.

After the plasma was stabilized at the deposition pressure, oxidants; nitrogen and oxygen gas were introduced. Typically, there was used a 30 standard cubic centimeter per minute (sccm) flow of N2, and about 0.5 sccm of oxygen. These values also changed from one deposition run to another, as shown in Table 1. Some deposition runs used no oxygen, and some used up to 3 sccm of oxygen. The introduction of the oxidant gasses partially poisoned the sputter target surfaces with nitrogen and oxygen, as could be seen by the decrease in voltage on the power supplies to the magnetrons. The exact degree of poisoning was not known. After a short stabilization time of about a minute, the shutters to the magnetron targets were opened, allowing the sputtered material to deposit onto the samples.

Table 1 shows deposition conditions for the various samples of Example 1.

TABLE 1

| Sample # | Deposition time (s) | Ar Flow (sccm) | N2 flow (sccm) | O2 flow (sccm) | Al RF power (W) | Al DC power (W) | Si RF power (W) | Deposition pressure (mT) | Substrate Bias (V) |
|---|---|---|---|---|---|---|---|---|---|
| Sample 1 | 4128 | 20 | 30 | 0.25 | 240 | 300 | 500 | 2 | 40 |
| Sample 2 | 9000 | 30 | 30 | 0.5 | 200 | 300 | 500 | 2 | 0 |
| Sample 3 | 9000 | 20 | 40 | 0.5 | 160 | 240 | 0 | 1.5 | 40 |
| Sample 4 | 9000 | 15 | 30 | 0.25 | 240 | 160 | 550 | 2.5 | 40 |
| Comparative Sample A | 9000 | 30 | 30 | 0.25 | 200 | 300 | 50 | 3 | 40 |
| Comparative Sample B | 9000 | 30 | 30 | 0.25 | 200 | 300 | 0 | 4 | 40 |

TABLE 1-continued

| Sample # | Deposition time (s) | Ar Flow (sccm) | N2 flow (sccm) | O2 flow (sccm) | Al RF power (W) | Al DC power (W) | Si RF power (W) | Deposition pressure (mT) | Substrate Bias (V) |
|---|---|---|---|---|---|---|---|---|---|
| Comparative Sample C | 9000 | 20 | 15 | 0.5 | 220 | 330 | 0 | 1.5 | 0 |
| Comparative Sample D | 9000 | 25 | 27.5 | 0.37 | 190 | 285 | 275 | 3.25 | 20 |

Table 2 shows the compositions of the coatings produced in Example 1.

TABLE #2

| Sample # | N | O | Al | Si |
|---|---|---|---|---|
| Sample 1 | 46.84 | 1.67 | 30.54 | 20.96 |
| Sample 2 | 43.84 | 4.67 | 28.20 | 23.28 |
| Sample 3 | 32.41 | 15.96 | 51.62 | 0.00 |
| Sample 4 | 45.68 | 3.82 | 24.76 | 25.74 |
| Comparative Sample A | 37.38 | 10.27 | 52.36 | 0.00 |
| Comparative Sample B | 36.91 | 10.37 | 52.72 | 0.00 |
| Comparative Sample C | 38.46 | 9.17 | 52.37 | 0.00 |
| Comparative Sample D | 42.99 | 5.66 | 39.20 | 12.15 |

Table 3 depicts properties as measured for the coatings of Example 1. Specifically, Table 3 shows coating thickness, strain-to-failure of the coating (for the coating residing on the substrate), strain-to-failure of the substrate (for the substrate as tested with the coating residing thereon), modulus (E) as measured for the coating residing on the substrate, hardness (H) as measured for the coating residing on the substrate, and the film stress (residual stress in the film) as measured using the techniques described above. The same conventions and aforementioned notes with respect to Table #3 were also used for the results reported in Table #4 below.

TABLE 3

| Sample # | Coating thickness (nm) | Coating strain to failure (%) | Substrate strain to failure (%) | E (GPa) | H (GPa) | Film stress (Mpa) (+ is tensile, − is compressive) |
|---|---|---|---|---|---|---|
| Sample 1 | 558 | 0.74 | 0.74 | 211 | 18 | −500 |
| Sample 2 | 1160 | 0.72 | 0.72 | 228 | 19.8 | −960 |
| Sample 3 | 408 | 0.73 | 0.73 | 173 | 17.5 | −442 |
| Sample 4 | 855 | 0.73 | 0.73 | 200 | 17.4 | −828 |
| Comparative Sample A | 460 | 0.59 | 0.99 | 188 | 17.8 | 147 |
| Comparative Sample B | 468 | 0.62 | 0.97 | 223 | 17 | 399 |
| Compamtive Sample C | 1152 | 0.31 | 0.35 | 229 | 20.9 | 479 |
| Comparative Sample D | 726 | 0.38 | 0.38 | 198 | 17.5 | −5 |

As shown in Table #3, films with residual compressive stress (for example, 5 MPa or more, more than 50 MPa, more than 100 MPa, more than 150 MPa, more than 200 MPa, more than 400 MPa, 500 MPa or more, more than 800 MPa, and more than 900 MPa, wherein a negative sign in the tables denotes compressive stress) did not crack prior to the failure of the substrate. That is, the coating and the substrate had the same strain to failure, i.e., they failed under the same load. Because the materials involved are brittle, and because the substrate thickness is much greater than that of the coating, when the substrate fails, the coating will fail along with it. Thus, when coating strain to failure equals substrate strain to failure, the coating was at least as robust as the substrate. In some instances, it is beneficial to have the coating and substrate be of similar robustness, i.e., fail at a similar strain to failure. However, in some instances, more desirable than achieving similar strain to failure between the coating and the substrate, is achieving a high strain to failure for each of the coating and substrate even if they are not similar to one another. That is, when both the substrate and coating have a high strain to failure, the product including such a coated substrate will be more durable in terms of applied load and flexure than a product including a coated substrate wherein strain to failure is similar between coating and substrate, but is low. Also, strain to failure is dependent upon the thickness of the coating and the thickness of the substrate. In Tables #3 and 4, the same substrate thickness was used throughout.

Thus, for example, comparing Comparative Sample D and Sample 6, which have similar coating thicknesses (726 nm and 720 nm, respectively), Sample 6 is more desirable because the coating strain to failure is higher than that in Comparative Sample D (0.61% versus 0.38%, respectively), even though the coating strain to failure in Comparative Sample D is similar to that of the substrate (0.38% for each), whereas the coating strain to failure of Sample 6 is lower than that of the substrate (0.61% versus 0.78%, respectively). Taking the comparison of these Samples further, the residual compressive stress in Sample 6 (about 200 MPa) is higher than that in Comparative Sample D (about 5 MPa), which leads to the higher coating strain to failure, and a more desirable coated substrate. That is, controlling the residual stress in the coating, particularly controlling the residual stress to be compressive, and more particularly controlling the residual stress to be of a sufficient level of compression, is desirable in increasing the strain to failure of the coating.

For example, Sample 2 and Comparative Sample C have about the same thickness (1160 nm versus 1152 nm), modulus (228 GPa versus 229 GPa), and hardness (19.8 GPa versus 20.9 GPa), but because of the higher residual compressive stress in Sample 2 (960 MPa versus a tensile residual stress of 479 MPa in Comparative Sample C), the Sample 2 coating strain to failure is much higher than that of Comparative Sample C (0.72% versus 0.31%).

Similarly, Sample 4 is preferred over Comparative Sample D because it has a higher strain to failure (0.73% versus 0.38%) for both coating and substrate, wherein these samples have similar hardness (17.4 GPa versus 17.5 GPa, respectively), and similar modulus (200 GPa versus 198 GPa, respectively). Again, it is seen that the higher compressive stress in Sample 4 (828 MPa versus the 5 MPa for Comparative Sample D) leads to the higher strain to failure (0.73% versus 0.38% of Comparative Sample D). Although Sample 4 had a somewhat higher thickness than that of Comparative Sample D (855 nm versus 726 nm, respectively), one would expect that the thinner coating would produce a higher strain to failure (for the same coating residual compressive stress) as shown in Table #4 of Example 2.

Example 2

Coatings were deposited onto Gorilla® Glass (Corning code #5318 having a CS of about 850 MPa, and a DOC of about 40 microns, and a thickness of 1.0 mm) using ion assisted plasma deposition utilizing a Tecport Symphony deposition device. Table 4 depicts the conditions for the deposition. All coatings of Example 2 were formed from AlON. The power applied to the Al magnetron during deposition was 4 kW. Deposition times varied, as shown in the Table 4. The argon flow applied to the magnetron was 40 sccm, and the argon flow applied to the ion gun was 25 sccm. The nitrogen flow applied to the ion gun was 45 sccm, and the oxygen flow applied to the ion gun was 2.5 sccm. Pumping for the deposition utilized 2 cyro pumps for 1.39 mT chamber pressure. The samples were rotated at 20 rpm. Table 4 also shows modulus and hardness for the samples, as well as the coated substrate strain-to failure.

the hardness, the more brittle the material will be and, thus, the lower its strain to failure. Thus, using the concepts in the present disclosure, one can appropriately balance coating properties (e.g., thickness, hardness, modulus, and residual stress) to design a coating having a desirable scratch resistance (high hardness and/or modulus) and durability (high strain to failure, for example high coating strain to failure).

For example, coatings having a thickness of from about 600 nm to about 1160 nm (for example, from about 700 nm to about 900 nm—See Samples 2, 4, 5, and 6), and hardnesses of greater than about 12 GPa (for example about 13 GPa or more, about 15 GPa or more, about 17 GPa or more, or about 19 GPa or more—see Samples 5, 6, 4, and 2, respectively) a coating strain to failure of greater than or equal to about 0.42% (for example, about 0.42% or more, about 0.6% or more, about 0.7% or more—see Samples 5, 6, and 2&4, respectively) can be achieved, with a residual compressive stress of more than 5 MPa, or more than 50 MPa, or more than 100 MPa (for example, more than 150 MPa, more than 200 MPa, more than 800 MPa, and more than 900 MPa—see Samples 6, 5, 4, and 2, respectively). Similarly, for example, coatings having a thickness of from about 300 nm to about 600 nm (for example, about 350 nm or more, 400 nm or more, or about 550 nm or more—see Samples 7, 3, and 1, respectively), and hardnesses of greater than or equal to about 14 GPa (for example 14 GPa or more, about 17 GPa or more, or about 18 GPa or more—see Samples 7, 3, and 1, respectively) a coating strain to failure of greater than about 0.65 (for example greater than about 0.7, about 0.74 or more, about 0.8 or more—see Samples 3, 1, and 7, respectively) can be achieved, with a residual compressive stress of more than 5 MPa or more than 50 MPa, or more than 75 MPa, or more than 100 MPa (for example, 200 MPa or more, more than 400 MPa, and 500 MPa or more—see Samples 7, 3, and 1, respectively).

As can be seen in the Table 3, for coated articles having a coating with 1 um thickness or greater and a (coating or article) hardness greater than 12, 14, 16, or 18 GPa, the coating strain-to-failure can be undesirably as low as 0.31

TABLE 4

| Sample # | Deposition time (s) | thickness (nm) | stress | E (GPa) | H (Gpa) | Coating strain to failure (%) | Substrate failure strain (%) |
|---|---|---|---|---|---|---|---|
| Sample 5 | 10800 | 1090 | −234.3 | 127 | 13.1 | 0.42 | 0.81 |
| Sample 6 | 7200 | 720 | −185.4 | 180 | 15.3 | 0.61 | 0.78 |
| Sample 7 | 3600 | 370 | −197.8 | 162 | 14.1 | 0.8 | 0.8 |

From Example 2, Samples 5-7, it is seen that for a given residual compressive stress (for example about 200 MPa) as coating thickness decreased from about 1000 nm to about 700 nm to about 350 nm, the coating strain to failure increased from about 0.4% to about 0.6% to about 0.8%

From the above Examples 1 and 2, it can be seen that: (i) for a given coating thickness, hardness, and modulus, higher residual compressive stress in the film leads to a desirably higher strain to failure in the film; (ii) for a given amount of residual compressive stress in the film, a thinner film leads to a higher strain to failure in the film; and (iii) that a desirable level of strain to failure in the film can be achieved with coatings having a variety of hardness and modulus, which may thus provide a desirable degree of scratch resistance. That is, generally, the higher the modulus and the higher the hardness of the coating, the better the scratch resistance. However, the higher the modulus and the higher (see Comparative Sample C) when the film stress is not carefully controlled, i.e., when the residual film stress is not sufficiently compressive. For this same coating thickness and hardness range, the coating strain to failure can be greater than 0.4, greater than 0.5, greater than 0.6, or greater than 0.7 when film stress is well controlled, i.e., residual film stress is controlled to be compressive, for example to have a residual compressive stress of more than 5 MPa, or more than 50 MPa, or more than 100 MPa, or more than 150 MPa, or more than 200 MPa, or more than 250 MPa, or more than 300 MPa, or more than 350 MPa, or more than 400 MPa, or more than 450 MPa, or more than 500 MPa, or more than 550 MPa, or more than 600 MPa, or more than 650 MPa, or more than 700 MPa, or more than 750 MPa, or more than 800 MPa, or more than 850 MPa, or more than 900 MPa, or more than 950 MPa.

Additionally, for coated articles having a coating in a thickness range of 600-1000 nm or 700-900 nm, with a hardness greater than 12, 14, or 16 GPa, coating strain-to-failure can be as low as 0.38 (as shown in Comparative Sample D) when film stress is not well controlled, i.e., when the residual film stress is not sufficiently compressive, but strain-to-failure can be greater than 0.45, greater than 0.55, greater than 0.65, or greater than 0.7 when film stress is well controlled, i.e., residual film stress is controlled to be compressive, for example to have a residual compressive stress of more than 5 MPa, or more than 50 MPa, or more than 100 MPa, or more than 150 MPa, or more than 200 MPa, or more than 250 MPa, or more than 300 MPa, or more than 350 MPa, or more than 400 MPa, or more than 450 MPa, or more than 500 MPa, or more than 550 MPa, or more than 600 MPa, or more than 650 MPa, or more than 700 MPa, or more than 750 MPa, or more than 800 MPa, or more than 850 MPa, or more than 900 MPa, or more than 950 MPa.

For coated articles having a coating in a thickness range of 400-600 nm, with a hardness greater than 12, 14, or 16 GPa, coating strain-to-failure can be as low as 0.59 (see Comparative Sample A) when film stress is not well controlled, but coating strain to failure can be greater than 0.65 or greater than 0.7 when film stress is well controlled, i.e., residual film stress is controlled to be compressive, for example to have a residual compressive stress of more than 5 MPa, or more than 50 MPa, or more than 100 MPa, or more than 150 MPa, or more than 200 MPa, or more than 250 MPa, or more than 300 MPa, or more than 350 MPa, or more than 400 MPa, or more than 450 MPa, or about 500 MPa or more.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about." It will be further understood that the endpoints of each of the ranges are significant both in relation to the other endpoint, and independently of the other endpoint.

The terms "substantial," "substantially," and variations thereof as used herein are intended to note that a described feature is equal or approximately equal to a value or description. For example, a "substantially planar" surface is intended to denote a surface that is planar or approximately planar. Moreover, "substantially" is intended to denote that two values are equal or approximately equal. In some embodiments, "substantially" may denote values within about 10% of each other, such as within about 5% of each other, or within about 2% of each other.

Directional terms as used herein—for example up, down, right, left, front, back, top, bottom—are made only with reference to the figures as drawn and are not intended to imply absolute orientation.

As used herein the terms "the," "a," or "an," mean "at least one," and should not be limited to "only one" unless explicitly indicated to the contrary. Thus, for example, reference to "a component" includes embodiments having two or more such components unless the context clearly indicates otherwise.

It will be apparent to those skilled in the art that various modifications and variations can be made to the present disclosure without departing from the spirit and scope of the disclosure. Thus, it is intended that the present disclosure cover such modifications and variations provided they come within the scope of the appended claims and their equivalents.

What is claimed is:

1. A coated article comprising:
   a substrate comprising a major surface;
   an optical coating disposed on the major surface of the substrate and forming an air-side surface, the optical coating comprising one or more layers of deposited material;
   wherein:
   at least a portion of the optical coating comprises a residual compressive stress of more than 100 MPa;
   the coated article comprises a strain-to-failure of 0.4% or more as measured by a Ring-on-Ring Tensile Testing Procedure;
   the optical coating comprises a maximum hardness of 8 GPa or more as measured on the air-side surface by a Berkovich Indenter Hardness Test along an indentation depth of 50 nm and greater; and
   the coated article comprises an average photopic transmission of 50% or greater.

2. The coated article of claim 1, wherein at least a portion of the optical coating comprises a residual compressive stress of more than 500 MPa.

3. The coated article of claim 1, wherein:
   the optical coating comprises a maximum hardness of 12 GPa or more as measured on the air-side surface by a Berkovich Indenter Hardness Test along an indentation depth of 50 nm and greater; and
   the optical coating comprises a physical thickness of 1 micron or greater.

4. The coated article of claim 1, wherein the coated article comprises an average photopic transmission of 80% or greater.

5. The coated article of claim 1, wherein the substrate comprises glass or glass-ceramic.

6. The coated article of claim 1, wherein the substrate is chemically strengthened.

7. The coated article of claim 1, wherein the optical coating is a single layer.

8. The coated article of claim 1, wherein the optical coating comprise two or more layers.

9. The coated article of claim 1, wherein the optical coating comprises a gradient layer, wherein the gradient layer changes in composition, refractive index, or both.

10. The coated article of claim 1, wherein:
    the optical coating further comprises a scratch-resistant layer; and
    the gradient layer is positioned between the substrate and the scratch-resistant layer.

11. The coated article of claim 1, wherein the optical coating comprises $SiO_xN_y$.

12. A consumer electronic product, comprising:
    a housing having a front surface, a back surface and side surfaces;
    electrical components provided at least partially within the housing, the electrical components including at least a controller, a memory, and a display, the display being provided at or adjacent the front surface of the housing; and a cover glass disposed over the display, wherein at least one of a portion of the housing or the cover glass comprises the coated article of claim 1.

13. A method for making a coated article, the method comprising:

depositing an optical coating onto a major surface of a substrate, the optical coating forming an air-side surface and comprising one or more layers of deposited material;

wherein:

at least a portion of the optical coating comprises a residual compressive stress of more than 100 MPa;

the coated article comprises a strain-to-failure of 0.4% or more as measured by a Ring-on-Ring Tensile Testing Procedure;

the optical coating comprises a maximum hardness of 8 GPa or more as measured on the air-side surface by a Berkovich Indenter Hardness Test along an indentation depth of 50 nm and greater; and the coated article comprises an average photopic transmission of 50% or greater.

14. The method of claim 13, wherein at least a portion of the optical coating comprises a residual compressive stress of more than 500 MPa.

15. The method of claim 13, wherein:

the optical coating comprises a maximum hardness of 12 GPa or more as measured on the air-side surface by a Berkovich Indenter Hardness Test along an indentation depth of 50 nm and greater; and the optical coating comprises a physical thickness of 1 micron or greater.

16. The method of claim 13, wherein the coated article comprises an average photopic transmission of 80% or greater.

17. The method of claim 13, wherein the substrate comprises glass or glass-ceramic.

18. The method of claim 13, wherein the substrate is chemically strengthened.

19. The method of claim 13, wherein the optical coating is a single layer.

20. The method of claim 13, wherein the optical coating comprise two or more layers.

\* \* \* \* \*